(12) United States Patent
Zhang et al.

(10) Patent No.: US 11,581,293 B2
(45) Date of Patent: Feb. 14, 2023

(54) LIGHT EMITTING DEVICE

(71) Applicant: KAISTAR Lighting(Xiamen) Co., Ltd., Xiamen (CN)

(72) Inventors: Jing-Qiong Zhang, Xiamen (CN); Tsung-Chieh Lin, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 216 days.

(21) Appl. No.: 17/169,644

(22) Filed: Feb. 8, 2021

(65) Prior Publication Data
US 2021/0167052 A1 Jun. 3, 2021

(30) Foreign Application Priority Data
May 8, 2020 (CN) .......................... 202010390172.X

(51) Int. Cl.
*H01L 25/13* (2006.01)
*H01L 33/48* (2010.01)

(52) U.S. Cl.
CPC ............ *H01L 25/13* (2013.01); *H01L 33/486* (2013.01)

(58) Field of Classification Search
CPC ................................................. H01L 33/46–48
See application file for complete search history.

(56) References Cited

U.S. PATENT DOCUMENTS

| 2020/0303598 | A1* | 9/2020 | Kim | .................... H01L 25/0753 |
| 2021/0193882 | A1* | 6/2021 | Soer | ...................... H05B 45/20 |
| 2021/0225814 | A1* | 7/2021 | Ueno | ........................ F21K 9/00 |
| 2022/0034457 | A1* | 2/2022 | Lambooij | ................ F21K 9/64 |

* cited by examiner

*Primary Examiner* — Steven B Gauthier
*Assistant Examiner* — Candice Chan
(74) *Attorney, Agent, or Firm* — Li & Cai Intellectual Property (USA) Office

(57) ABSTRACT

A light emitting device is provided. The light emitting device includes a light emitting assembly having a first light emitting diode package structure and a second light emitting diode package structure. The light emitting assembly can generate a mixed light source having a spectral deviation index. The first light emitting diode package structure can generate a first light source having a first spectral deviation index. The second light emitting diode package structure can generate a second light source having a second spectral deviation index. When the first light source and the second light source are within a range from 460 to 500 nm, a sum of the first spectral deviation index and the second spectral deviation index is within a range from −0.3 to 0.3, and a difference between the first spectral deviation index and the second spectral deviation index is at least greater than 0.2.

20 Claims, 16 Drawing Sheets

LIGHT EMITTING DEVICE

CROSS-REFERENCE TO RELATED PATENT APPLICATION

This application claims the benefit of priority to China Patent Application No. 202010390172.X, filed on May 8, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting device, and more particularly to a light emitting device that includes at least two package structures having different white light spectrums.

BACKGROUND OF THE DISCLOSURE

A conventional light emitting device generates a light source through a light emitting diode. A plurality of broadband chips used in the light emitting diode have different quantum wells (QW). Any one of energy band gaps (Eg) between the different quantum wells is different. When an electron is electrically recombined, the energy of recombination for different energy band gaps is different. The result is that a spectrum of any one of the broadband chips produced in the same batch is different from that of another one of the broadband chips produced in the same batch. In order to ensure that all of the spectrums of each of the products (i.e., the conventional light emitting device) are consistent with each other and meet qualified specifications, a manufacturer will only select the broadband chips that meet the qualified specifications to manufacture the light emitting diodes that are qualified for production of the light emitting device. That is to say, all the white light spectrums of each of the light emitting diodes are consistent with each other. Therefore, the aforementioned method leads to low utilization rate of the broadband chips and increases overall manufacturing costs.

SUMMARY OF THE DISCLOSURE

In response to the above-referenced technical inadequacies, the present disclosure provides a light emitting device to effectively improve on issues associated with the conventional light emitting devices.

In one aspect, the present disclosure provides a light emitting device. The light emitting device has a standard spectrum that corresponds to a white light spectrum. The light emitting device includes a light emitting assembly. The light emitting assembly can generate a mixed light source that has a mixed light spectrum corresponding to the white light spectrum. A value derived from an intensity of a wavelength of the mixed light spectrum minus an intensity of a wavelength of the standard spectrum corresponding to the wavelength of the mixed light spectrum and then divided by the intensity of the wavelength of the standard spectrum corresponding to the wavelength of the mixed light spectrum is defined as a spectral deviation index of the mixed light source. The light emitting assembly includes a first light emitting diode package structure and a second light emitting diode package structure. The first light emitting diode package structure includes a first chip and a first package body that covers the first chip. The first chip cooperates with the first package body so as to generate a first light source that has a first spectrum corresponding to the white light spectrum. A value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index. The second light emitting diode package structure includes a second chip and a second package body that covers the second chip. The second chip cooperates with the second package body so as to generate a second light source. The white light spectrum of the second light source is different from the white light spectrum of the first light source, and the second light source has a second spectrum corresponding to the white light spectrum. A value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index. The first light source and the second light source are mixed to form the mixed light source. The first condition is that a sum of the first spectral deviation index plus the second spectral deviation index is within a range from −0.3 to 0.3. The second condition is that when the wavelength of the first light source and the wavelength of the second light source are the same, a difference between the first spectral deviation index and the second spectral deviation index is at least greater than 0.2. When each of the wavelength of the first light source and the wavelength of the second light source is within a range from 460 to 500 nanometers, an absolute value of the first spectral deviation index and an absolute value of the second spectral wave deviation index are each greater than or equal to 1.1 times of an absolute value of the spectral deviation index of the mixed light source.

In another aspect, the present disclosure provides a light emitting device. The light emitting device has a standard spectrum that corresponds to a white light spectrum. The light emitting device includes a light emitting assembly. The light emitting assembly can generate a mixed light source that has a mixed light spectrum corresponding to the white light spectrum. The light emitting assembly includes a first light emitting diode package structure and a second light emitting diode package structure. The first light emitting diode package structure includes a first chip and a first package body that covers the first chip. The first chip cooperates with the first package body to generate a first light source that has a first spectrum corresponding to the white light spectrum. A value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index. The second light emitting diode package structure includes a second chip and a second package body that covers the second chip. The second chip cooperates with the second package body to generate a second light source. The white light spectrum of the second light source is different from the white light spectrum of the first light source, and the second light source has a second spectrum corresponding to the white light spectrum. A value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index. Each of the first light source and the second light source is configured to satisfy a first condition. The first condition is that when the first light source and the second light source in at least one spectral range a range between 440 and 660 nanometers have a same wavelength with each other, a difference between the first spectral deviation index and the second spectral deviation index is at least greater than 0.05.

In yet another aspect, the present disclosure provides a light emitting device. The light emitting device has a standard spectrum that corresponds to a white light spectrum. The light emitting device includes a light emitting assembly. The light emitting assembly is configured to generate a mixed light source that has a mixed light spectrum corresponding to the white light spectrum. A value derived from an intensity of a wavelength of the mixed light spectrum minus an intensity of a wavelength of the standard spectrum corresponding to the wavelength of the mixed light spectrum and then divided by the intensity of the wavelength of the standard spectrum corresponding to the wavelength of the mixed light spectrum is defined as a spectral deviation index of the mixed light source. The light emitting assembly includes a first light emitting diode package structure and a second light emitting diode package structure.

The first light emitting diode package structure includes a first chip and a first package body that covers the first chip. The first chip cooperates with the first package body so as to generate a first light source that has a first spectrum corresponding to the white light spectrum. A value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index. The second light emitting diode package structure includes a second chip and a second package body that covers the second chip. The second chip cooperates with the second package body so as to generate a second light source. The white light spectrum of the second light source is different from the white light spectrum of the first light source, and the second light source has a second spectrum corresponding to the white light spectrum. A value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index. The first light source and the second light source are mixed to form the mixed light source. When each of the wavelength of the first light source and the wavelength of the second light source is within a range from 460 to 500 nanometers, each of the first light source and the second light source is configured to satisfy a first condition and a second condition. The first condition is that a sum of the first spectral deviation index plus the second spectral deviation index is within a range from −0.3 to 0.3. The second condition is that when the wavelength of the first light source and the wavelength of the second light source are the same, a difference between the first spectral deviation index and the second spectral deviation index is at least greater than 0.2 The intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

Therefore, by virtue of "the mixed light source generated by the light emitting devices of the present disclosure being composed of the first light source and the second light source having different white light spectrums", the light emitting devices can use the light emitting diode package structures (i.e., the first light emitting diode package structure and the second light emitting diode package structure) having different white light spectrums, and the spectrum of each of the light emitting devices and the spectrum of the target light source are still consistent with each other, whilst meeting qualified specifications. Accordingly, a utilization rate of chips during manufacturing can be increased, and manufacturing costs can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF EMBODIMENTS

Figure 1:
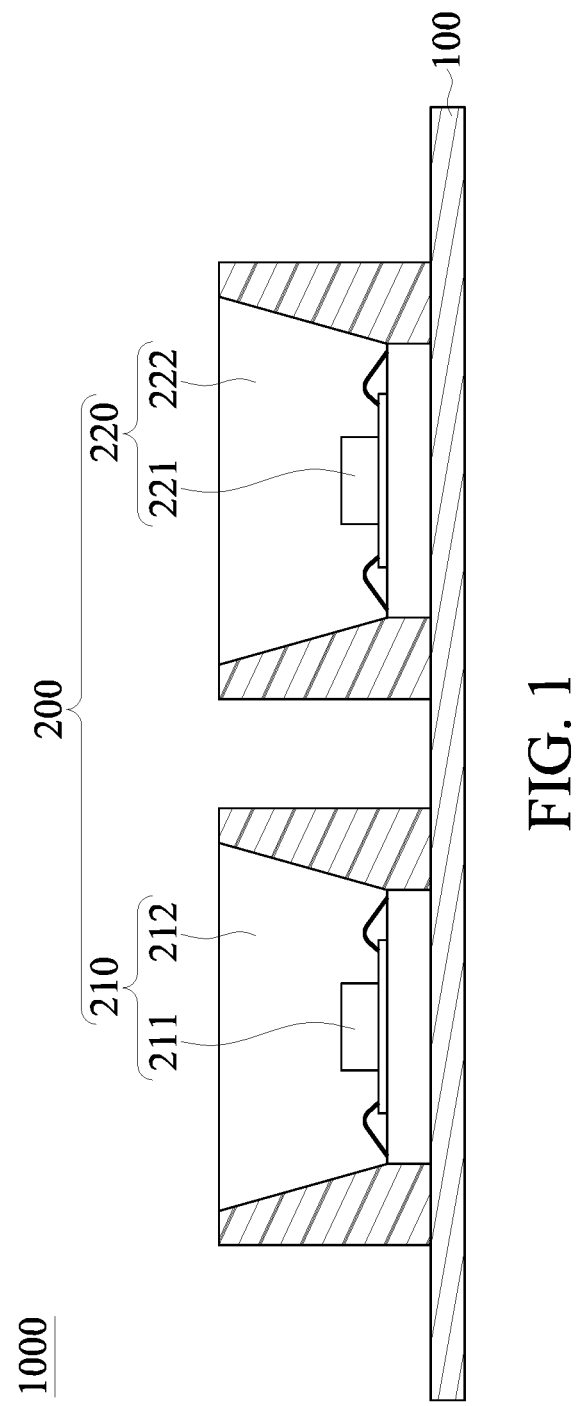
FIG. 1 is a cross-sectional schematic view of a light emitting device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a light emitting device 1000. FIG. 1 to FIG. 13 show a plurality of embodiments that are based on an inventive concept of the present disclosure. Referring to FIG. 1, the light emitting device 1000 includes a substrate 100 and a light emitting assembly 200 that is disposed on the substrate 100. The light emitting device 1000 presets a target light source, and has a standard spectrum corresponding to a white light spectrum. In detail, the target light source is a light source that the light emitting device 1000 will finally emit, and the standard spectrum corresponds to a specification of the target light source. The light emitting assembly 200 can emit a mixed light source (i.e., the light source that the light emitting device 1000 will finally emit), the mixed light source is composed of two light sources having different white light spectrums, and approximates to the white light spectrum of the target light source. In other words, any light emitting device that does not emit a final light source (i.e., the mixed light source) by mixing at least two light sources having different white light spectrums is not the light emitting device 1000 of the present disclosure.

Referring to FIG. 1, the light emitting assembly 200 includes a first light emitting diode package structure 210 and a second emitting diode package structure 220. The first light emitting diode package structure 210 includes a first substrate, a first chip 211 disposed on the first substrate, a first package body 212 covering the first chip 211, and a first side wall that surrounds the first package body 212. The second light emitting diode package structure 220 includes a second substrate, a second chip 221 disposed on the second substrate, a second package body 222 covering the second chip 221, and a second side wall that surrounds the second package body 222.

The first chip 211 cooperates with the first package body 212 so as to generate a first light source that has a first spectrum corresponding to the white light spectrum. A value derived from that is an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index.

The second chip 221 cooperates with the second package body 222 so as to generate a second light source. The white light spectrum of the second light source is different from the white light spectrum of the first light source, and the second light source has a second spectrum corresponding to the white light spectrum. A value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index.

Specifically, the mixed light source is composed of the first light source and the second light source, and has a mixed light spectrum corresponding to the white light spectrum. A value derived from an intensity of a wavelength of the mixed light spectrum minus an intensity of a wavelength of the standard spectrum corresponding to the wavelength of the mixed light spectrum and then divided by the intensity of the wavelength of the standard spectrum corresponding to the wavelength of the mixed light spectrum is defined as a spectral deviation index of the mixed light source.

In order to ensure that the spectrum of the mixed light source and the spectrum of the target light source are consistent with each other, and to ensure that the spectrum of the mixed light source meets a qualified specification, when each of the wavelength of the first light source and the wavelength of the second light source is within a range from 460 to 500 nanometers, each of the first light source and the second light source is configured to satisfy a first condition and a second condition.

The first condition is that a sum of the first spectral deviation index plus the second spectral deviation index is within a range from −0.3 to 0.3.

The second condition is that when the wavelength of the first light source and the wavelength of the second light source are the same, a difference between the first spectral deviation index and the second spectral deviation index is at least greater than 0.2.

In detail, when each of the first light source and the second light source satisfies the first condition and the second condition, an absolute value of the first spectral deviation index and an absolute value of the second spectral wave deviation index are respectively greater than or equal to 1.1 times of an absolute value of the spectral deviation index of the mixed light source, and the spectral deviation index of the mixed light source is within a range from −0.2 to 0.4. In addition, when each of the first light source and the second light source in the white light spectrum is within a range from 450 to 500 nanometers, the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

Based on the above-mentioned inventive concept, the first light source and the second light source in the present disclosure can cooperate with the first condition and the second condition to produce a plurality of embodiments. The following provides the embodiments for description.

First Embodiment

Referring to FIG. 1 to FIG. 5, a first embodiment of the present disclosure provides a light emitting device 1000. The light emitting device 1000 has a standard spectrum that corresponds to a white light spectrum. The light emitting device 1000 includes a light emitting assembly 200, and the light emitting assembly 200 has a first light emitting diode package structure 210 and a second light emitting diode package structure 220. The first light emitting diode package structure 210 can generate a first light source Z, and the second light emitting diode package structure 220 can generate a second light source X. The first light source Z and the second light source X can be mixed into the mixed light source ZX.

It should be noted that in order to facilitate description of the technical features of the light emitting device 1000 of the present embodiment, the standard spectrum that is corresponding to the target light source K is exemplified by black body radiation, but the present disclosure is not limited thereto. For example, when a designer adjusts the target light source K according to requirements, the standard spectrum can be adjusted according to the target light source K to be another standard spectrum that corresponds to a specific light radiation.

In order to ensure that the spectrum of the mixed light source ZX composed of the first light source Z and the second light source X and the spectrum of the target light source K are consistent with each other, and to ensure that the spectrum of the mixed light source ZX meets the qualified specification, when each of the wavelength of the first light source Z and the wavelength of the second light source X is within a range from 460 to 500 nanometers, each of the first light source Z and the second light source X needs to satisfy a first condition and a second condition.

Figure 2:
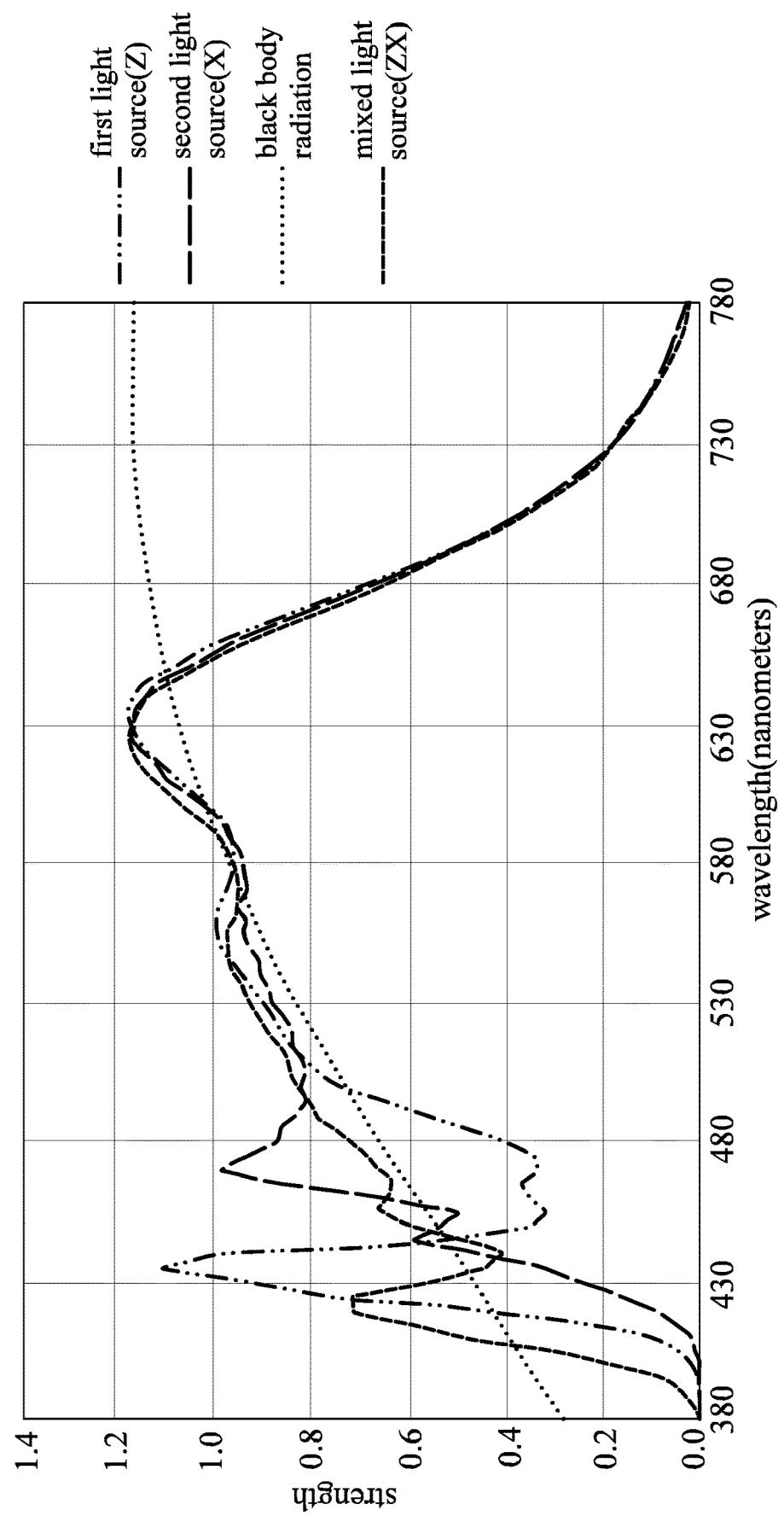
FIG. 2 is a white light spectrum diagram of a first light source, a second light source, and a black body radiation according to a first embodiment of the present disclosure.

Reference is made to FIG. 2, which is a diagram showing a waveform of the first spectrum of the first light source Z, a waveform of the second spectrum of the second light source X, a waveform of the mixed light source spectrum of the mixed light source ZX, and a waveform of the standard spectrum (i.e., the black body radiation). In other words, said diagram shows the white light spectrum of the first light source Z, the second light source X, and the mixed light source ZX, as well as the standard spectrum. The horizontal axis of the diagram is wavelength (nm), and the vertical axis of the diagram is intensity.

The first spectral deviation index is derived from an intensity of a wavelength of the first spectrum in FIG. 2 minus an intensity of a wavelength of the standard spectrum corresponding to the wavelength of the first spectrum in FIG. 2 and then divided by the intensity of the wavelength of the standard spectrum corresponding to the wavelength of the first spectrum in FIG. 2. The second spectral deviation index is derived from an intensity of a wavelength of the second spectrum in FIG. 2 minus an intensity of a wavelength of the standard spectrum corresponding to the wavelength of the second spectrum in FIG. 2 and then divided by the intensity of the wavelength of the standard spectrum corresponding to the wavelength of the second spectrum in FIG. 2. The spectral deviation index of the mixed light source is derived from an intensity of a wavelength of the mixed light source spectrum in FIG. 2 minus an intensity of a wavelength of the standard spectrum corresponding to the wavelength of the mixed light source spectrum in FIG. 2 and then divided by the intensity of the wavelength of the standard spectrum corresponding to the wavelength of the mixed light source spectrum in FIG. 2.

Figure 3:
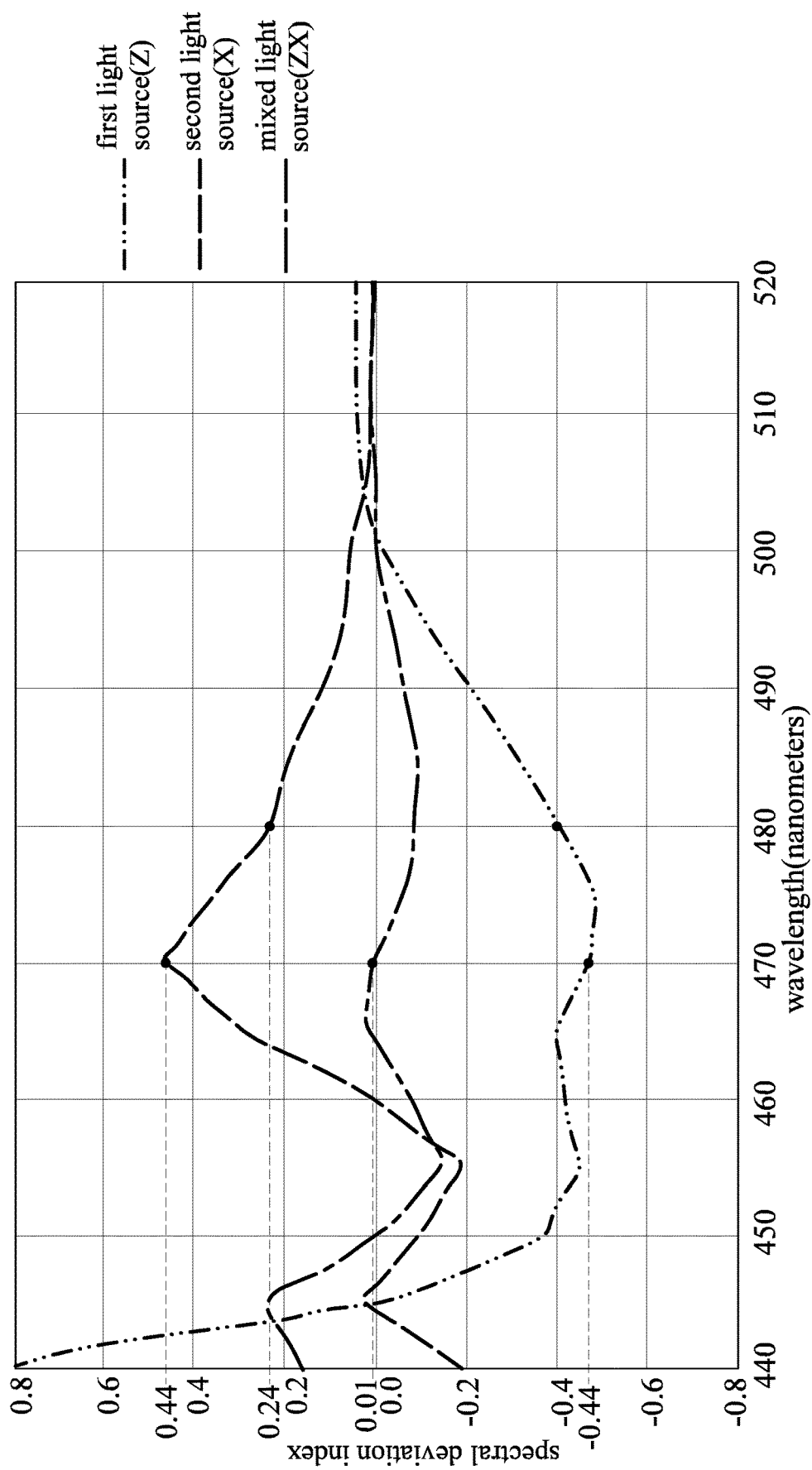
FIG. 3 is a diagram showing spectral deviation indexes of the first light source, the second light source, and a mixed light source according to the first embodiment of the present disclosure.

In other words, in FIG. 3, the horizontal axis of the diagram represents wavelength (nm) and the vertical axis of the diagram represents spectral deviation index, thus allowing the spectral deviation indexes of the first light source Z, the second light source X, and the mixed light source ZX relative to the standard spectrum to be illustrated therein.

Referring to FIG. 3, when the wavelength is at 470 nanometers, the first spectral deviation index is approximately −0.44, and the second spectral deviation index is approximately 0.44. In other words, the sum of the first spectral deviation index and the second spectral deviation index is 0, and the difference between the first spectral deviation index and the second spectral deviation index is 0.88. That is to say, the first spectral deviation index and the second spectral deviation index are opposite numbers to each other.

Furthermore, when the wavelength is at 480 nanometers, the first spectral deviation index is approximately −0.4, and the second spectral deviation index is approximately 0.24. The sum of the first spectral deviation index and the second spectral deviation index is −0.16, and the difference between the first spectral deviation index and the second spectral deviation index is 0.64.

In addition, when each of the first spectral deviation index and the second spectral deviation index shown in the diagram of FIG. 3 is within a wavelength range of 460 to 500 nanometers, the sum of the first spectral deviation index and the second spectral deviation index is within a range from −0.3 to 0.3, which means that the first condition is satisfied. When the first spectral deviation index and the second spectral deviation index are at the same wavelength, the difference between the first spectral deviation index and the second spectral deviation index is at least greater than 0.2, which means that the second condition is satisfied.

In a range from 450 to 500 nanometers of the white light spectrum, the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

When each of the first light source Z and the second light source X satisfies the first condition and the second condition, the results are that each of the wavelength of the first light source Z and the wavelength of the second light source X is within a range from 460 to 500 nanometers, and an absolute value of the first spectral deviation index and an absolute value of the second spectral wave deviation index are respectively greater than or equal to 1.1 times of an absolute value of the spectral deviation index of the mixed light source ZX.

In other words, referring to FIG. 3, when the wavelength is at 470 nanometers, the absolute value of the spectral deviation index of the mixed light source ZX is approximately 0.01, the absolute value of the first spectral deviation index of the first light source Z is approximately 0.44, and the absolute value of the second spectral deviation index of the second light source X is approximately 0.44. From this, the absolute value of the first spectral deviation index and the absolute value of the second spectral deviation index are both greater than 1.1 times of the absolute value of the spectral deviation index of the mixed light source ZX (i.e., 0.011).

Figure 4:
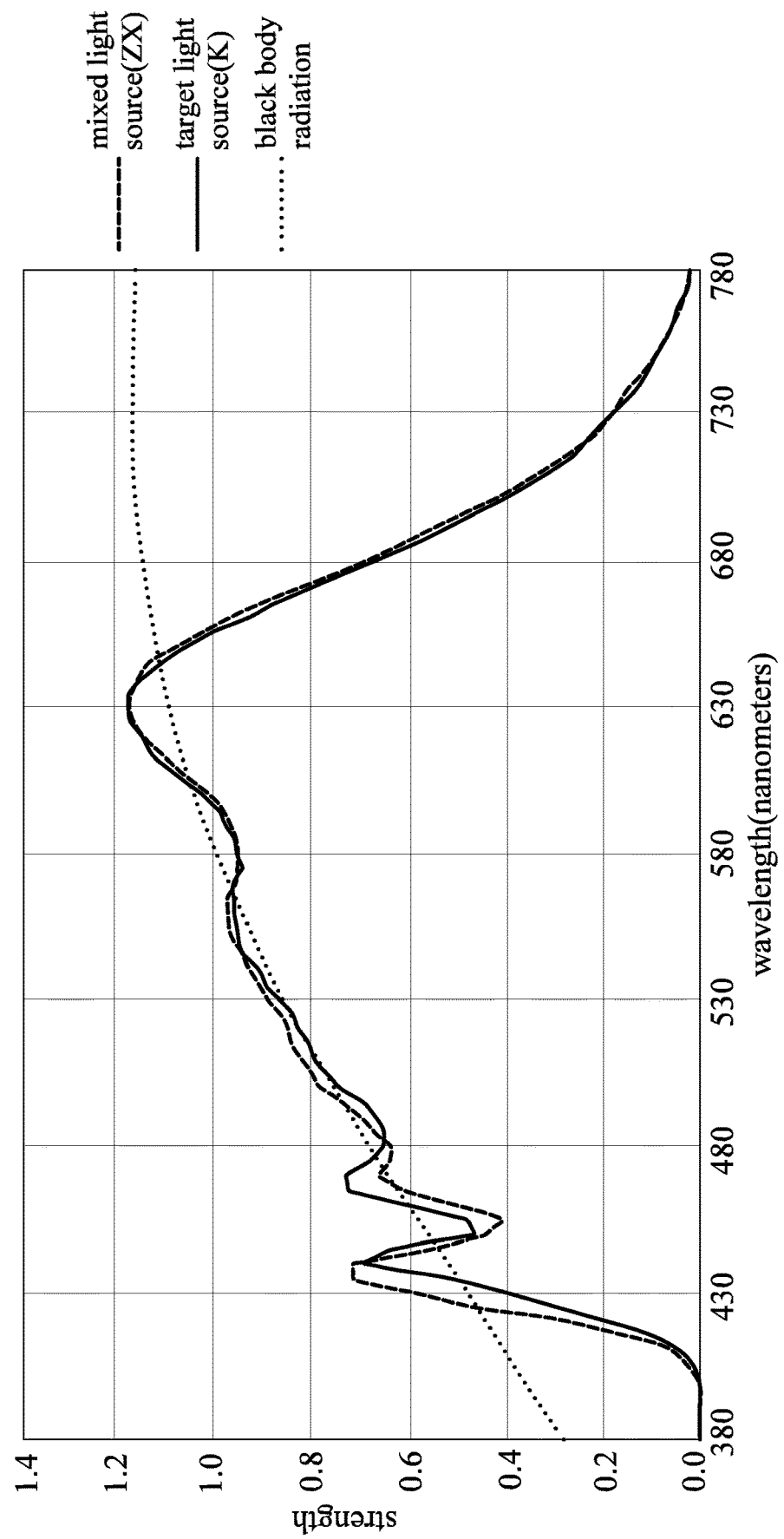
FIG. 4 is a white light spectrum diagram of the mixed light source, a target light source, and the black body radiation according to the first embodiment of the present disclosure.

Reference is made to FIG. 4, which is a white light spectrum diagram showing a waveform of the target light source K, a waveform of the standard spectrum, and a waveform of the mixed light source spectrum of the mixed light source ZX. The horizontal axis of the diagram is wavelength (nm), and the vertical axis of the diagram is intensity. It is obvious from FIG. 4 that the spectrum of the mixed light source ZX and the spectrum of the target light source K are consistent with each other.

Figure 5:
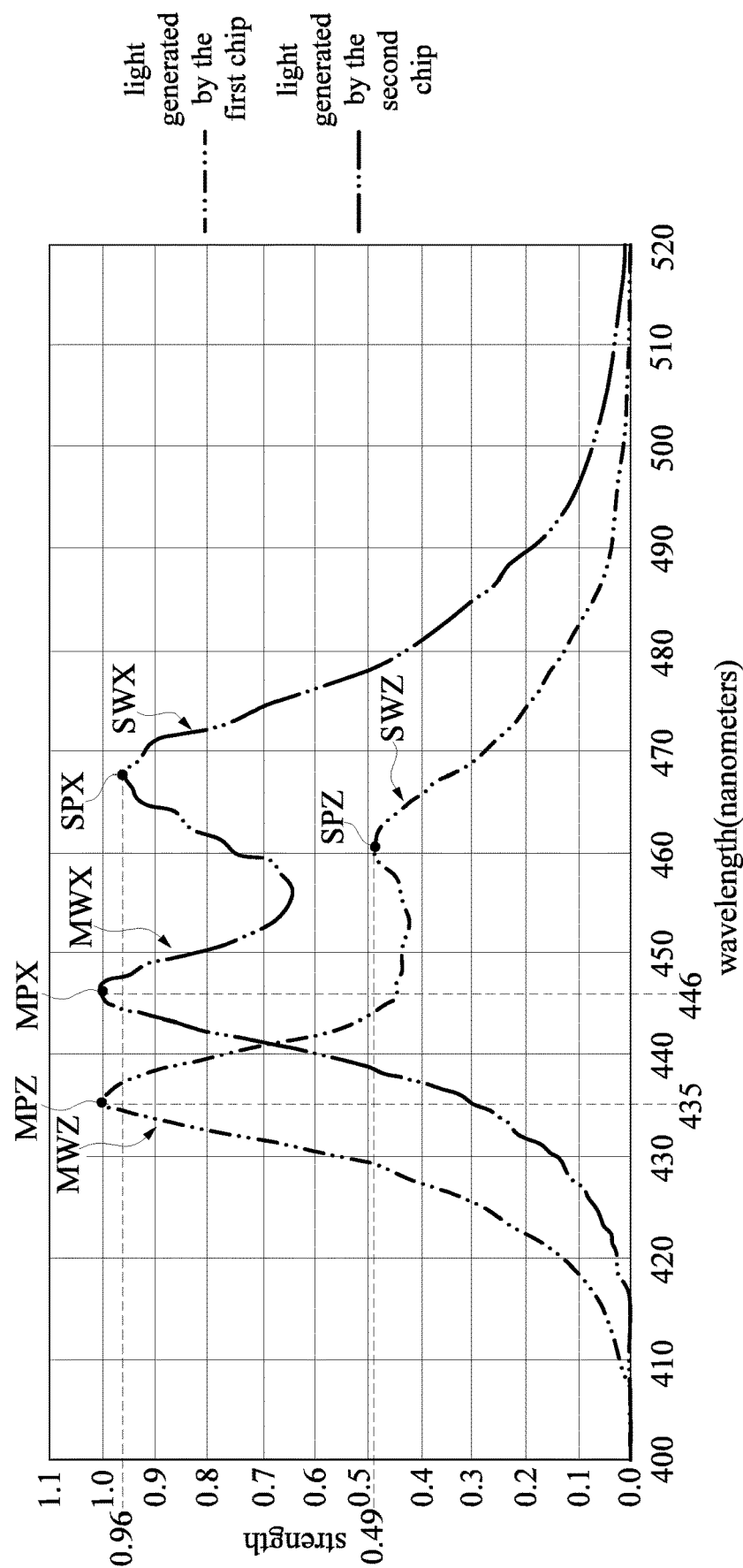
FIG. 5 is a broad-band blue light spectrum diagram of a light generated by the first chip and a light generated by the second chip according to the first embodiment of the present disclosure.

In other words, referring to FIG. 5, a light (not the first light source Z) generated by the first chip 211 of the first light emitting diode package structure 210 has a first main wave MWZ and a first shoulder wave SWZ on a broad-band blue light spectrum. The first main wave MWZ has a peak wavelength intensity MPZ, and the first shoulder wave SWZ has a peak wavelength intensity SPZ that is lower than the peak wavelength intensity MPZ of the first main wave MWZ. A value derived from dividing the peak wavelength intensity SPZ of the first shoulder wave SWZ by the peak wavelength intensity MPZ of the first main wave MWZ is defined as a first intensity ratio. It should be noted that in another embodiment of the present disclosure that is not shown, the peak wavelength intensity SPZ of the first shoulder wave SWZ can also be replaced with an inflection point of the first shoulder wave SWZ.

A light (not the second light source X) generated by the second chip 221 of the second light emitting diode package structure 220 is different from the light generated by the first chip 221. The light generated by the second chip 221 has a second main wave MWX and a second shoulder wave SWX on the broad-band blue light spectrum. The second main wave MWX has a peak wavelength intensity MPX, and the second shoulder wave SWX has a peak wavelength intensity SPX that is lower than the peak wavelength intensity MPX of the second main wave MWX. A value derived from dividing the peak wavelength intensity SPX of the second shoulder wave SWX by the peak wavelength intensity MPX of the second main wave MWX is defined as a second intensity ratio. It should be noted that in another embodiment of the present disclosure that is not shown, the peak wavelength intensity SPX of the second shoulder wave SWX can also be replaced with an inflection point of the second shoulder wave SWX.

Specifically, after the intensity of the first chip 211 and the intensity of the second chip 221 are normalized on the broad-band blue light spectrum, there is a difference between a waveform of the first chip 211 and a waveform of the second chip 221. The difference is at least that "the first intensity ratio is different from the second intensity ratio" or "the peak wavelength intensity MPZ of the first main wave MWZ is different from the peak wavelength intensity MPX of the second main wave MWX".

When each of the first light source Z and the second light source X satisfies the first condition and the second condition, a difference between the peak wavelength intensity MPZ of the first main wave MWZ of the first chip 211 and the peak wavelength intensity MPX of the second main wave MWX of the second chip 221 is greater than 2.5 nanometers or is less than or equal to 5 nanometers, and a difference between the first intensity ratio and the second intensity ratio is greater than 0.2.

Reference is made to FIG. 5, which is a diagram showing each of the light generated by the first chip 211 and the light generated by the second chip 221 in a corresponding to broad-band blue light spectrum. The horizontal axis of the diagram is wavelength (nm), and the vertical axis of the diagram is intensity.

The waveforms shown in the diagram are the light generated by the first chip 211 of the first light emitting diode package structure 210 and the light generated by the second chip 221 of the second light emitting diode package structure 220 that satisfy the first condition and the second condition.

It is obvious from FIG. 5 that a wavelength of the peak wavelength intensity MPZ of the first main wave MWZ is approximately 435 nanometers, and a wavelength of the peak wavelength intensity MPX of the second main wave MWX is approximately 446 nanometers. In other words, a difference between the wavelength of the peak wavelength intensity MPZ and the wavelength of the peak wavelength intensity MPX is 11 nanometers. That is to say, the difference is greater than 2.5 nanometers.

The peak wavelength intensity SPZ of the first shoulder wave SWZ is approximately 0.49, the peak wavelength intensity MPZ of the first main wave MWZ is approximately 1.0, the peak wavelength intensity SPX of the second shoulder wave SWX is approximately 0.96, and the peak wavelength intensity MPX of the second main wave MWX is approximately 1.0. In other words, the first intensity ratio is 0.49, the second intensity ratio is 0.96, and a difference between the first intensity ratio and the second intensity ratio is 0.47 (that is, the difference is greater than 0.2).

In addition, referring to FIG. 5, the wavelength of the peak wavelength intensity MPZ of the first main wave MWZ and the wavelength of the peak wavelength intensity MPX of the second main wave MWX are within a range from 430 to 455 nanometers, and the wavelength of the peak wavelength intensity SPZ of the first shoulder wave SWZ and the wavelength of the peak wavelength intensity SPX of the second shoulder wave SWX are within a range from 445 to 475 nanometers.

Second Embodiment

Referring to FIG. 6 to FIG. 9, the present embodiment is similar to the first embodiment, and the similarities therebetween will not be repeated. The difference between the present embodiment and the first embodiment mainly lies in that the light emitting diode package structures 210, 220 of the present embodiment are different from the light emitting diode package structures 210, 220 of the first embodiment.

Figure 6:
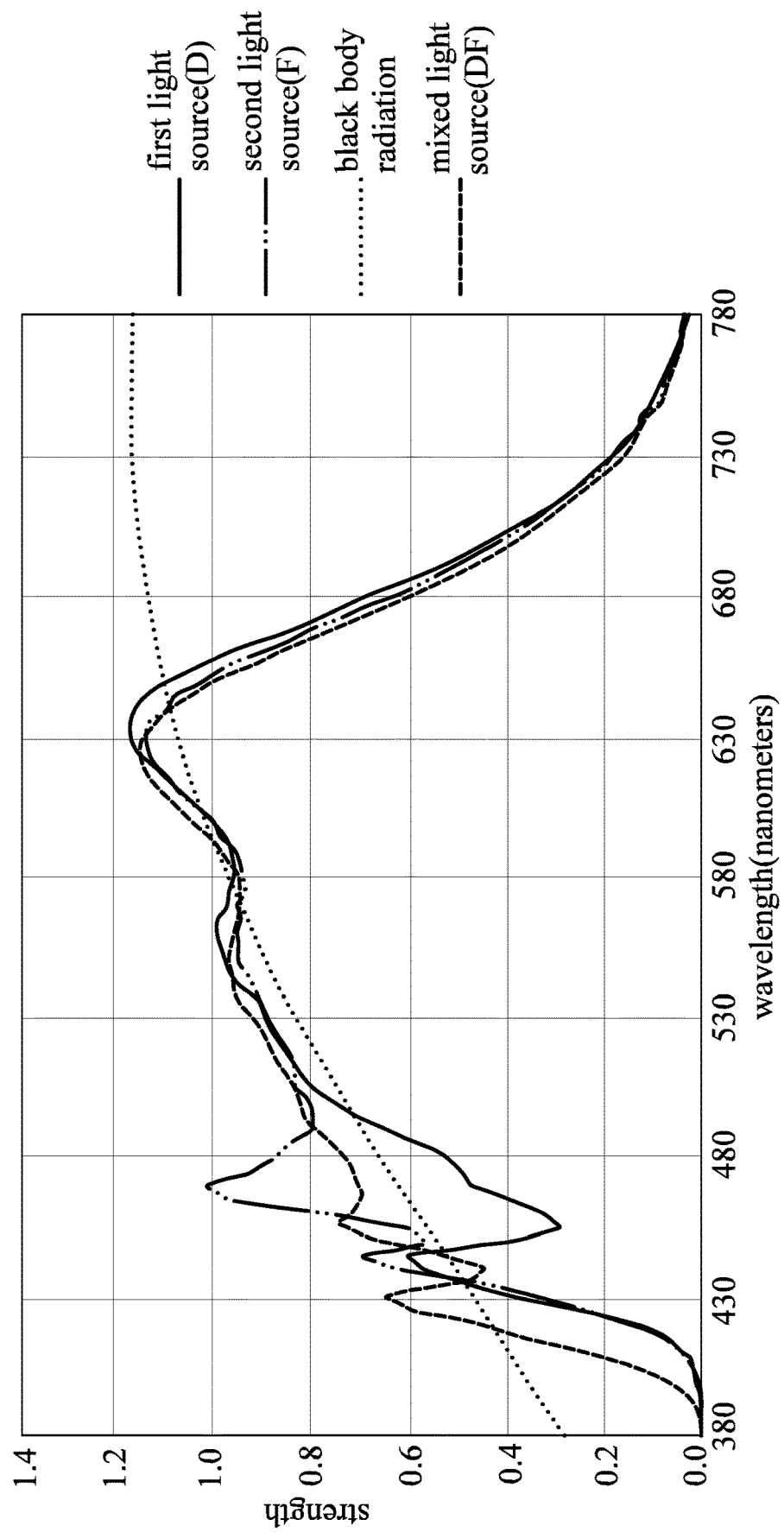
FIG. 6 is white light spectrum a diagram of a first light source, a second light source, and a black body radiation according to a second embodiment of the present disclosure.

Reference is made to FIG. 6, which is a white light spectrum diagram showing a waveform of the first spectrum of the first light source D, a waveform of the second spectrum of the second light source F, a waveform of the mixed light source spectrum of the mixed light source DF, and a waveform of the standard spectrum (i.e., the black body radiation). In other words, said diagram shows the white light spectrum of the first light source D, the white light spectrum of the second light source F, the white light spectrum of the mixed light source DF, and the standard spectrum. The horizontal axis of the diagram is wavelength (nm), and the vertical axis of the diagram is intensity.

The first spectral deviation index is derived from an intensity of a wavelength of the first spectrum in FIG. 6 minus an intensity of a wavelength of the standard spectrum corresponding to the wavelength of the first spectrum in FIG. 6 and then divided by the intensity of the wavelength of the standard spectrum corresponding to the wavelength of the first spectrum in FIG. 6. The second spectral deviation index is derived from an intensity of a wavelength of the second spectrum in FIG. 6 minus an intensity of a wavelength of the standard spectrum corresponding to the wavelength of the second spectrum in FIG. 6 and then divided by the intensity of the wavelength of the standard spectrum corresponding to the wavelength of the second spectrum in FIG. 6. The spectral deviation index of the mixed light source is derived from an intensity of a wavelength of the mixed light source spectrum in FIG. 6 minus an intensity of a wavelength of the standard spectrum corresponding to the wavelength of the mixed light source spectrum in FIG. 6 and then divided by the intensity of the wavelength of the standard spectrum corresponding to the wavelength of the mixed light source spectrum in FIG. 6.

Figure 7:
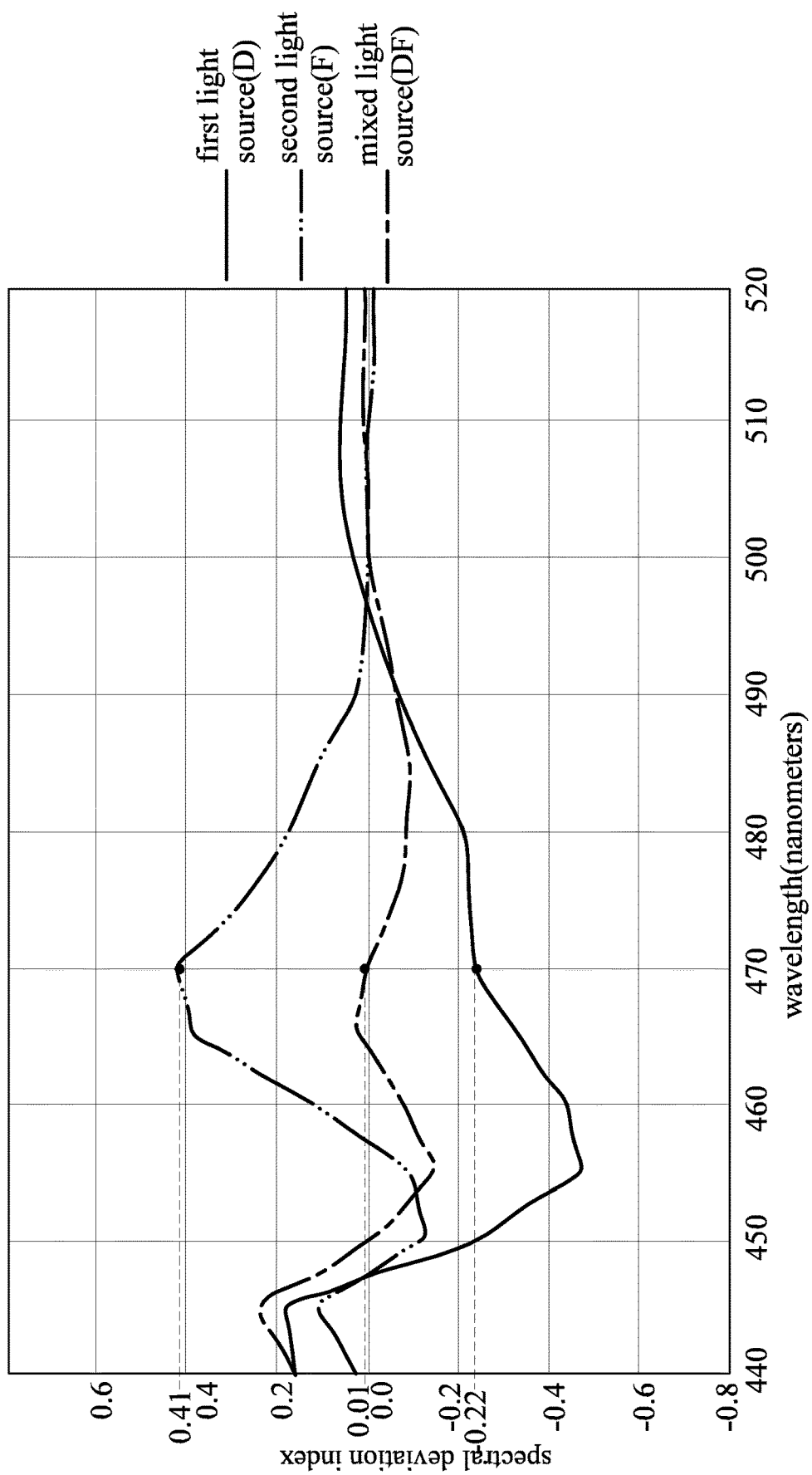
FIG. 7 is a diagram showing spectral deviation indexes of the first light source, the second light source, and a mixed light source according to the second embodiment of the present disclosure.

In other words, when the horizontal axis of the diagram is wavelength (nm) and the vertical axis of the diagram is spectral deviation index, a diagram in FIG. 7 can be generated by the spectral deviation indexes and wavelengths of the first light source D, the second light source F, and the mixed light source DF.

When each of the first spectral deviation index and the second spectral deviation index shown in the diagram of FIG. 7 is within a wavelength range of 460 to 500 nanometers, the sum of the first spectral deviation index and the second spectral deviation index is within a range from −0.3 to 0.3, which means that the first condition is satisfied. When the first spectral deviation index and the second spectral deviation index are at the same wavelength, the difference between the first spectral deviation index and the second spectral deviation index is at least greater than 0.2, which means that the second condition is satisfied.

In a range from 450 to 500 nanometers of the white light spectrum, the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

For example, referring to the diagram in FIG. 7, when the wavelength is at 470 nanometers, the first spectral deviation index is approximately −0.22 and the second spectral deviation index is approximately 0.41. In other words, the sum of the first spectral deviation index and the second spectral deviation index is 0.19, and the difference between the first spectral deviation index and the second spectral deviation index is 0.63.

When each of the first light source D and the second light source F satisfies the first condition and the second condition, the results are that each of a wavelength of the first light source D and a wavelength of the second light source F is within a range from 460 to 500 nanometers, and an absolute value of the first spectral deviation index and an absolute value of the second spectral wave deviation index are respectively greater than or equal to 1.1 times of an absolute value of the spectral deviation index of the mixed light source DF.

Referring to FIG. 7, when the wavelength is at 470 nanometers, the absolute value of the spectral deviation index of the mixed light source DF is approximately 0.01, the absolute value of the first spectral deviation index of the first light source D is approximately 0.22, and the absolute value of the second spectral deviation index of the second light source F is approximately 0.41. From this, the absolute value of the first spectral deviation index and the absolute value of the second spectral deviation index are both greater than 1.1 times of the absolute value of the spectral deviation index of the mixed light source DF (i.e., 0.011).

Figure 8:
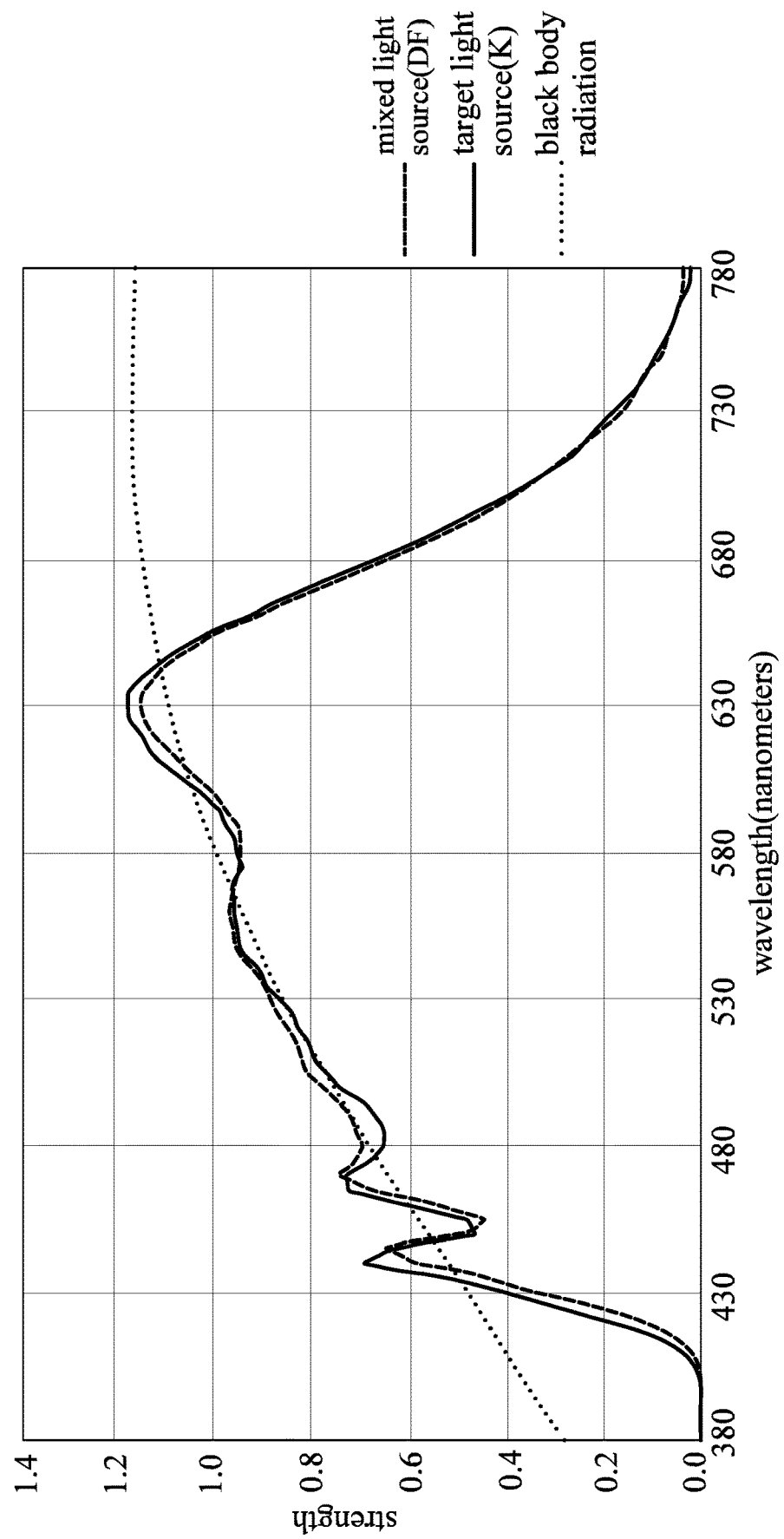
FIG. 8 is a white light spectrum diagram of the mixed light source, a target light source, and the black body radiation according to the second embodiment of the present disclosure.

Reference is made to FIG. 8, which is a white light spectrum diagram showing a waveform of the target light source K, a waveform of the standard spectrum, and a waveform of the mixed light source spectrum of the mixed light source DF. The horizontal axis of the diagram is wavelength (nm), and the vertical axis of the diagram is intensity. It is obvious from FIG. 8 that the spectrum of the mixed light source DF and the spectrum of the target light source K are consistent with each other.

Figure 9:
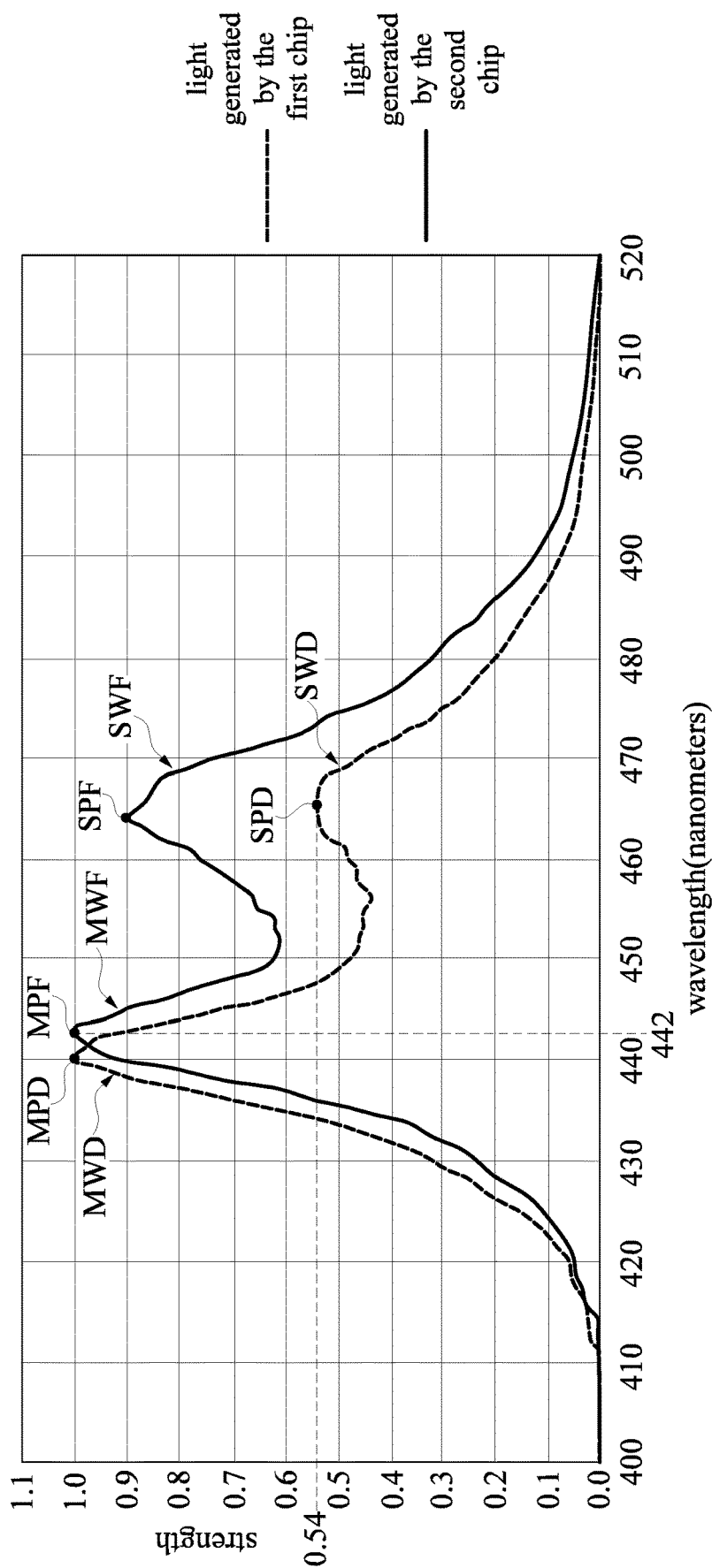
FIG. 9 is a broad-band blue light spectrum diagram of a light generated by the first chip and a light generated by the second chip according to the second embodiment of the present disclosure.

Reference is made to FIG. 9, which is a broad-band blue light spectrum diagram showing the light generated by the first chip 211 and the light generated by the second chip 221. The horizontal axis of the diagram is wavelength (nm), and the vertical axis of the diagram is intensity. The waveforms shown in the diagram are the light generated by the first chip 211 of the first light emitting diode package structure 210 and the light generated by the second chip 221 of the second light emitting diode package structure 220 that satisfy the first condition and the second condition.

Furthermore, when each of the first light source D generated by the first light emitting diode package structure 210 and the second light source F generated by the second light emitting diode package structure 220 satisfies the first condition and the second condition, a difference between the peak wavelength intensity MPD of the first main wave MWD and the peak wavelength intensity MPF of the second main wave MWF is less than or equal to 2.5 nanometers, and a difference between the first intensity ratio and the second intensity ratio is greater than 0.2.

It is obvious from FIG. 9 that a wavelength of the peak wavelength intensity MPD of the first main wave MWD is approximately 440 nanometers, and a wavelength of the peak wavelength intensity MPF of the second main wave MWF is approximately 442 nanometers. In other words, a difference between the wavelength of the peak wavelength intensity MPD and the wavelength of the peak wavelength intensity MPF is 2 nanometers. That is to say, the difference is less than or equal to 2.5 nanometers.

The peak wavelength intensity SPD of the first shoulder wave SWD is approximately 0.54, the peak wavelength intensity MPD of the first main wave MWD is approximately 1.0, the peak wavelength intensity SPF of the second shoulder wave SWF is approximately 0.9, and the peak wavelength intensity MPF of the second main wave MWF is approximately 1.0. In other words, the first intensity ratio is 0.54, the second intensity ratio is 0.9, and a difference between the first intensity ratio and the second intensity ratio is 0.36 (that is, the difference is greater than 0.2).

From this, when each of the first light source D generated by the first light emitting diode package structure 210 and the second light source F generated by the second light emitting diode package structure 220 in the present embodiment satisfies the first condition and the second condition, the difference between the peak wavelength intensity MPD of first chip 211 and the peak wavelength intensity MPF of second chip 221 in the present embodiment is different from the difference between the peak wavelength intensity MPZ and the peak wavelength intensity MPX in the first embodiment. The difference between the peak wavelength intensity MPD and the peak wavelength intensity MPF in the present embodiment is less than or equal to 2.5 nanometers.

Third Embodiment

Referring to FIG. 10 to FIG. 13, the present embodiment is similar to the first embodiment, and the similarities therebetween will not be repeated herein. The difference between the present embodiment and the first embodiment mainly lies in that the light emitting diode package structures 210, 220 of the present embodiment are different from the light emitting diode package structures 210, 220 of the first embodiment.

Figure 10:
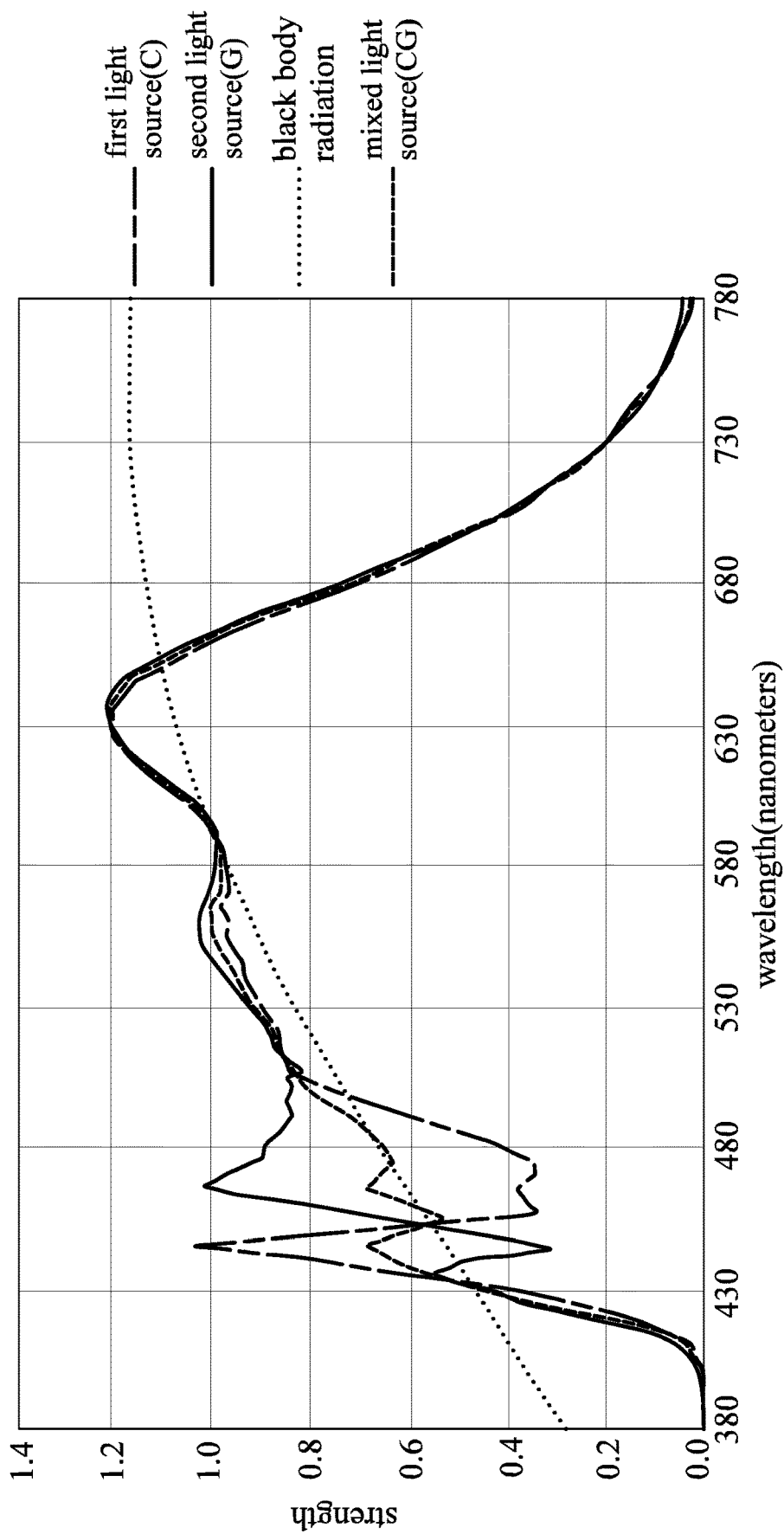
FIG. 10 is a white light spectrum diagram of a first light source, a second light source, and a black body radiation according to a third embodiment of the present disclosure.

Reference is made to FIG. 10, which is a diagram showing a waveform of the first spectrum of the first light source C, a waveform of the second spectrum of the second light source G, a waveform of the mixed light source spectrum of the mixed light source CG, and a waveform of the standard spectrum (i.e., the black body radiation). In other words, said diagram shows the white light spectrum of the first light source C, the second light source G, and the mixed light source CG, as well as the standard spectrum. The horizontal axis of the diagram is wavelength (nm), and the vertical axis of the diagram is intensity.

The first spectral deviation index is derived from an intensity of a wavelength of the first spectrum in FIG. 10 minus an intensity of a wavelength of the standard spectrum corresponding to the wavelength of the first spectrum in FIG. 10 and then divided by the intensity of the wavelength of the standard spectrum corresponding to the wavelength of the first spectrum in FIG. 10. The second spectral deviation index is derived from an intensity of a wavelength of the second spectrum in FIG. 10 from an intensity of a wavelength of the standard spectrum corresponding to the wavelength of the second spectrum in FIG. 10 and then divided by the intensity of the wavelength of the standard spectrum corresponding to the wavelength of the second spectrum in FIG. 10. The spectral deviation index of the mixed light source is derived from an intensity of a wavelength of the mixed light source spectrum in FIG. 10 from an intensity of a wavelength of the standard spectrum corresponding to the wavelength of the mixed light source spectrum in FIG. 10 and then divided by the intensity of the wavelength of the standard spectrum corresponding to the wavelength of the mixed light source spectrum in FIG. 10.

Figure 11:
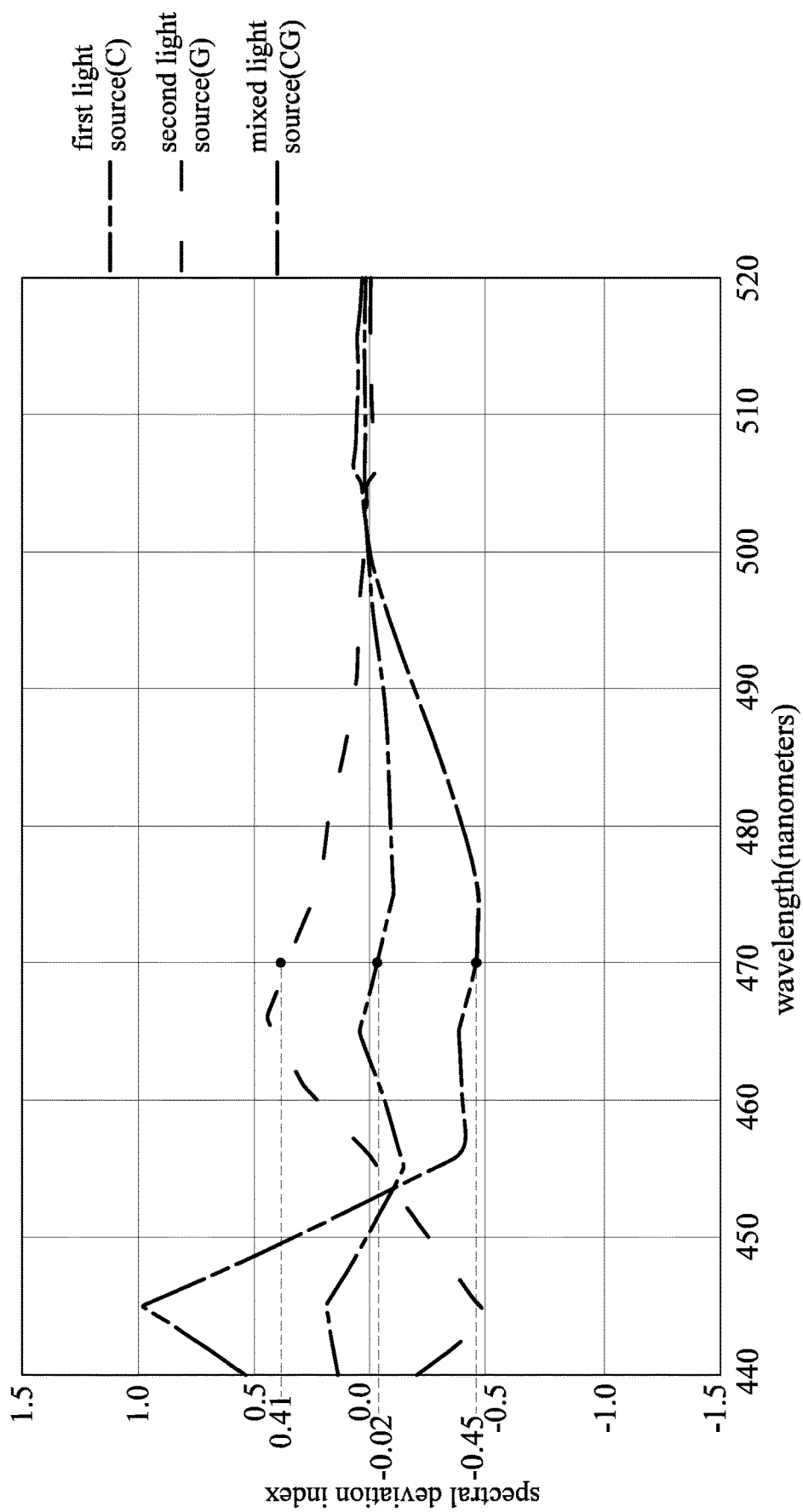
FIG. 11 is a diagram showing spectral deviation indexes of the first light source, the second light source, and a mixed light source according to the third embodiment of the present disclosure.

In other words, when the horizontal axis of the diagram is wavelength (nm) and the vertical axis of the diagram is spectral deviation index, a diagram in FIG. 11 can be generated by the spectral deviation indexes and wavelengths of the first light source C, the second light source G, and the mixed light source CG.

When each of the first spectral deviation index and the second spectral deviation index shown in the diagram of FIG. 11 is within a wavelength range of 460 to 500 nanometers, the sum of the first spectral deviation index and the second spectral deviation index is within a range from −0.3 to 0.3, which means that the first condition is satisfied. When the first spectral deviation index and the second spectral deviation index are at the same wavelength, the difference between the first spectral deviation index and the second spectral deviation index is at least greater than 0.2, which means that the second condition is satisfied.

In a range from 450 to 500 nanometers of the white light spectrum, the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

For example, referring to the diagram in FIG. 11, when the wavelength is at 470 nanometers, the first spectral deviation index is approximately −0.45 and the second spectral deviation index is approximately 0.41. In other words, the sum of the first spectral deviation index and the second spectral deviation index is −0.04, and the difference between the first spectral deviation index and the second spectral deviation index is 0.86.

When each of the first light source C and the second light source G satisfies the first condition and the second condition, the results are that each of a wavelength of the first light source C and a wavelength of the second light source G is within a range from 460 to 500 nanometers, and an absolute value of the first spectral deviation index and an absolute value of the second spectral wave deviation index are respectively greater than or equal to 1.1 times of an absolute value of the spectral deviation index of the mixed light source CG.

When the wavelength is at 470 nanometers, the absolute value of the spectral deviation index of the mixed light source CG is approximately 0.02, the absolute value of the first spectral deviation index of the first light source C is approximately 0.45, and the absolute value of the second spectral deviation index of the second light source F is approximately 0.41. From this, the absolute value of the first spectral deviation index and the absolute value of the second spectral deviation index are both greater than 1.1 times of the absolute value of the spectral deviation index of the mixed light source CG (i.e., 0.022).

Figure 12:
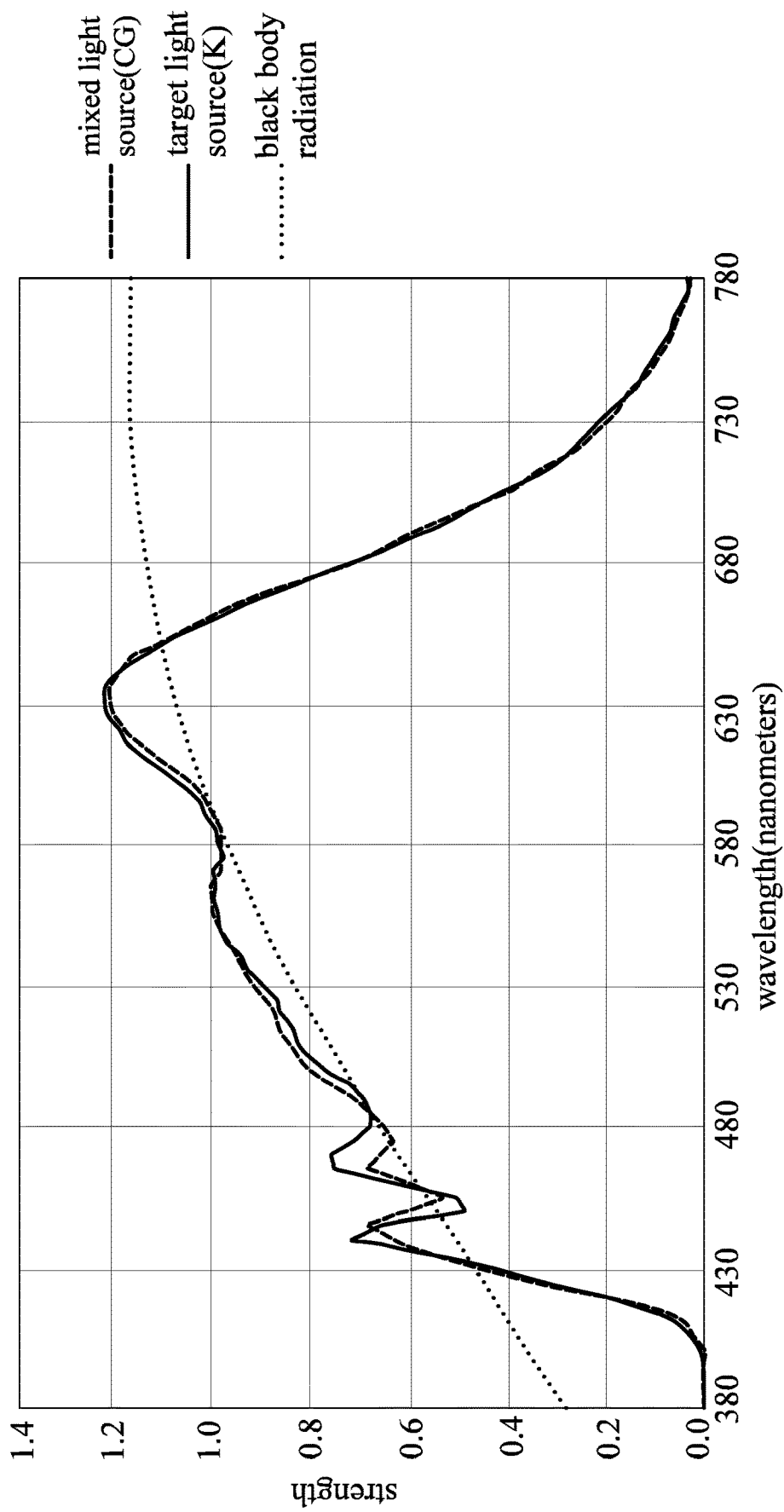
FIG. 12 is white light spectrum a diagram of the mixed light source, a target light source, and the black body radiation according to the third embodiment of the present disclosure.

In other words, reference is made to FIG. 12, which is a white light spectrum diagram showing a waveform of the target light source K, a waveform of the standard spectrum, and a waveform of the mixed light source spectrum of the mixed light source CG. The horizontal axis of the diagram is wavelength (nm), and the vertical axis of the diagram is intensity. It is obvious from FIG. 12 that the spectrum of the mixed light source CG and the spectrum of the target light source K are consistent with each other.

Figure 13:
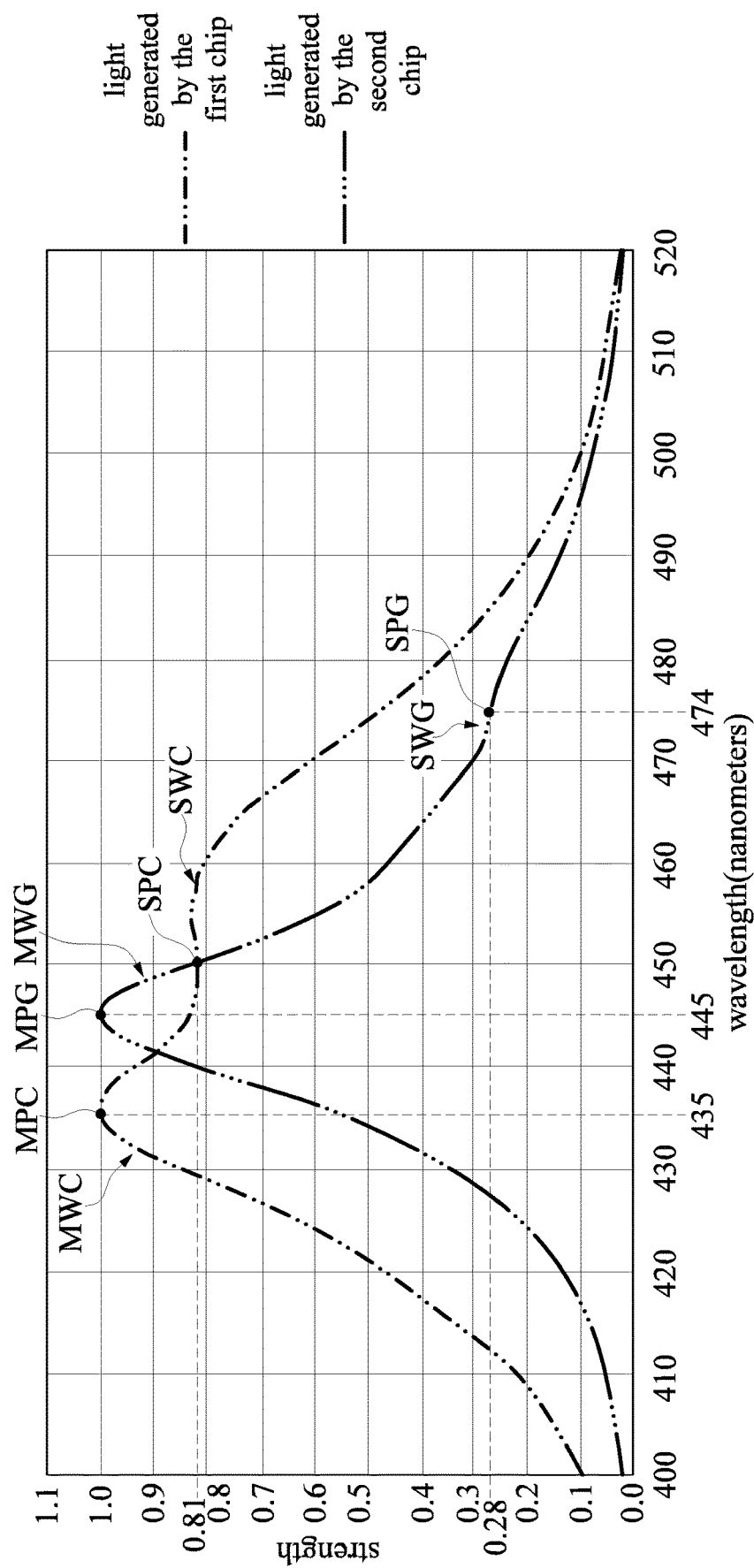
FIG. 13 is a broad-band blue light spectrum diagram of a light generated by the first chip and a light generated by the second chip according to the third embodiment of the present disclosure.

Reference is made to FIG. 13, which is a broad-band blue light spectrum diagram showing the light generated by the first chip 211 and the light generated by the second chip 221. The horizontal axis of the diagram is wavelength (nm), and the vertical axis of the diagram is intensity. The waveforms shown in the diagram is the light generated by the first chip 211 of the first light emitting diode package structure 210 and the light generated by the second chip 221 of the second light emitting diode package structure 220 that satisfy the first condition and the second condition.

Furthermore, when each of the first light source C generated by the first light emitting diode package structure 210 and the second light source G generated by the second light emitting diode package structure 220 satisfies the first condition and the second condition, a difference between the peak wavelength intensity MPC of the first main wave MWC and the peak wavelength intensity MPG of the second main wave MWG is greater than or equal to 5 nanometers, and a difference between the first intensity ratio and the second intensity ratio is greater than 0.2.

It is obvious from FIG. 13 that a wavelength of the peak wavelength intensity MPC of the first main wave MWC is approximately 435 nanometers, and a wavelength of the peak wavelength intensity MPG of the second main wave MWG is approximately 445 nanometers. In other words, a difference between the wavelength of the peak wavelength intensity MPC and the wavelength of the peak wavelength intensity MPG is 10 nanometers (that is, the difference is greater than or equal to 5 nanometers).

The peak wavelength intensity SPC of the first shoulder wave SWC is approximately 0.81, the peak wavelength intensity MPC of the first main wave MWC is approximately 1.0, the peak wavelength intensity SPG of the second shoulder wave SWG is approximately 0.28, and the peak wavelength intensity MPG of the second main wave MWG is approximately 1.0. In other words, the first intensity ratio is 0.81, the second intensity ratio is 0.28, and a difference between the first intensity ratio and the second intensity ratio is 0.53 (that is, the difference is greater than 0.2).

From this, when each of the first light source C generated by the first light emitting diode package structure 210 and the second light source G generated by the second light emitting diode package structure 220 in the present embodiment satisfies the first condition and the second condition, the difference between the peak wavelength intensity MPC of first chip 211 and the peak wavelength intensity MPG of second chip 221 in the present embodiment is greater than or equal to 5 nanometers.

Furthermore, when each of the first light source C generated by the first light emitting diode package structure 210 and the second light source G generated by the second light emitting diode package structure 220 in the present embodiment satisfies the first condition and the second condition, the wavelength of the peak wavelength intensity MPC of first chip 211 and the wavelength of the peak wavelength intensity MPG of second chip 221 in the broad-band blue light spectrum are within a range from 430 to 455 nanometers, and the wavelength of the peak wavelength intensity SPC of the first shoulder wave SWC and the wavelength of the peak wavelength intensity SPG of the second shoulder wave SWG are within a range from 445 to 475 nanometers.

It is worth noting that the light emitting device 1000 of the present disclosure can also be matched with the target light source K in various combinations or any one combination. For example, a combination of the first light source Z and the second light source X in the first embodiment can cooperate with a combination of the first light source D and the second light source F in the second embodiment, so as to obtain a spectrum that is consistent with the spectrum of the target light source K. Of course, the first embodiment, the second embodiment, and the third embodiment can also cooperate with each other, so as to obtain a spectrum that is consistent with the spectrum of the target light source K.

Fourth Embodiment

The present disclosure additionally provides a light emitting device 1000. Referring to FIG. 1, the light emitting device 1000 includes a substrate 100 and a light emitting assembly 200 that is disposed on the substrate 100. The light emitting device 1000 presets a target light source K, and has a standard spectrum corresponding to a white light spectrum. In detail, the target light source is a light source that the light emitting device 1000 will finally emit, and the standard spectrum corresponds to a specification of the target light source. The light emitting assembly 200 can emit a mixed light source, and the mixed light source is composed of two light sources having different white light spectrums, and conforms to the white light spectrum of the target light source. In other words, any light emitting device that does not emit a final light source (i.e., the mixed light source) by mixing at least two light sources having different white light spectrums is not the light emitting device 1000 of the present disclosure.

Referring to FIG. 1, the light emitting assembly 200 includes a first light emitting diode package structure 210 and a second emitting diode package structure 220. The first light emitting diode package structure 210 includes a first substrate, a first chip 211 disposed on the first substrate, a first package body 212 covering the first chip 211, and a first side wall surrounding the first package body 212. The second light emitting diode package structure 220 includes a second substrate, a second chip 221 disposed on the second substrate, a second package body 222 covering the second chip 221, and a second side wall surrounding the second package body 222.

The first chip 211 cooperates with the first package body 212 so as to generate a first light source that has a first spectrum corresponding to the white light spectrum. A value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index.

Furthermore, a light generated by the first chip 211 has a first main wave and a first shoulder wave on a broad-band blue light spectrum. The first main wave has a peak wavelength intensity, and the first shoulder wave has a peak wavelength intensity that is lower than the peak wavelength intensity of the first main wave. A value derived from dividing the peak wavelength intensity of the first shoulder wave by the peak wavelength intensity of the first main wave is defined as a first intensity ratio.

The second chip 221 cooperates with the second package body 222 so as to generate a second light source. The white light spectrum of the second light source is different from the white light spectrum of the first light source, and the second light source has a second spectrum corresponding to the white light spectrum. A value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index.

Furthermore, a broad-band blue light spectrum of a light generated by the second chip 221 is different from the broad-band blue light spectrum of the light generated by the first chip 211. The light generated by the second chip 221 has a second main wave and a second shoulder wave on the broad-band blue light spectrum. The second main wave has a peak wavelength intensity, and the second shoulder wave has a peak wavelength intensity that is lower than the peak wavelength intensity of the second main wave. A value derived from dividing the peak wavelength intensity of the second shoulder wave by the peak wavelength intensity of the second main wave is defined as a second intensity ratio.

In order to ensure that the spectrum of the mixed light source and the spectrum of the target light source are consistent with each other, and to ensure that the spectrum of the mixed light source meets a qualified specification, each of the first light source and the second light source is configured to satisfy a first condition.

The first condition is that when the first light source and the second light source in at least one spectral range that is within a range between 440 and 660 nanometers have a same wavelength with each other, a difference between the first spectral deviation index and the second spectral deviation index is at least greater than 0.05. Specifically, the at least one spectral range is within a range from 440 to 490 nanometers, 500 to 560 nanometers, or 600 to 660 nanometers. When each of the first light source and the second light source satisfies the first condition, a difference between the peak wavelength intensity of the first main wave of the first chip 211 and the peak wavelength intensity of the second main wave of the second chip 221 is less than or equal to 5 nanometers, and a difference between the first intensity ratio and the second intensity ratio is less than 0.4.

Figure 14:
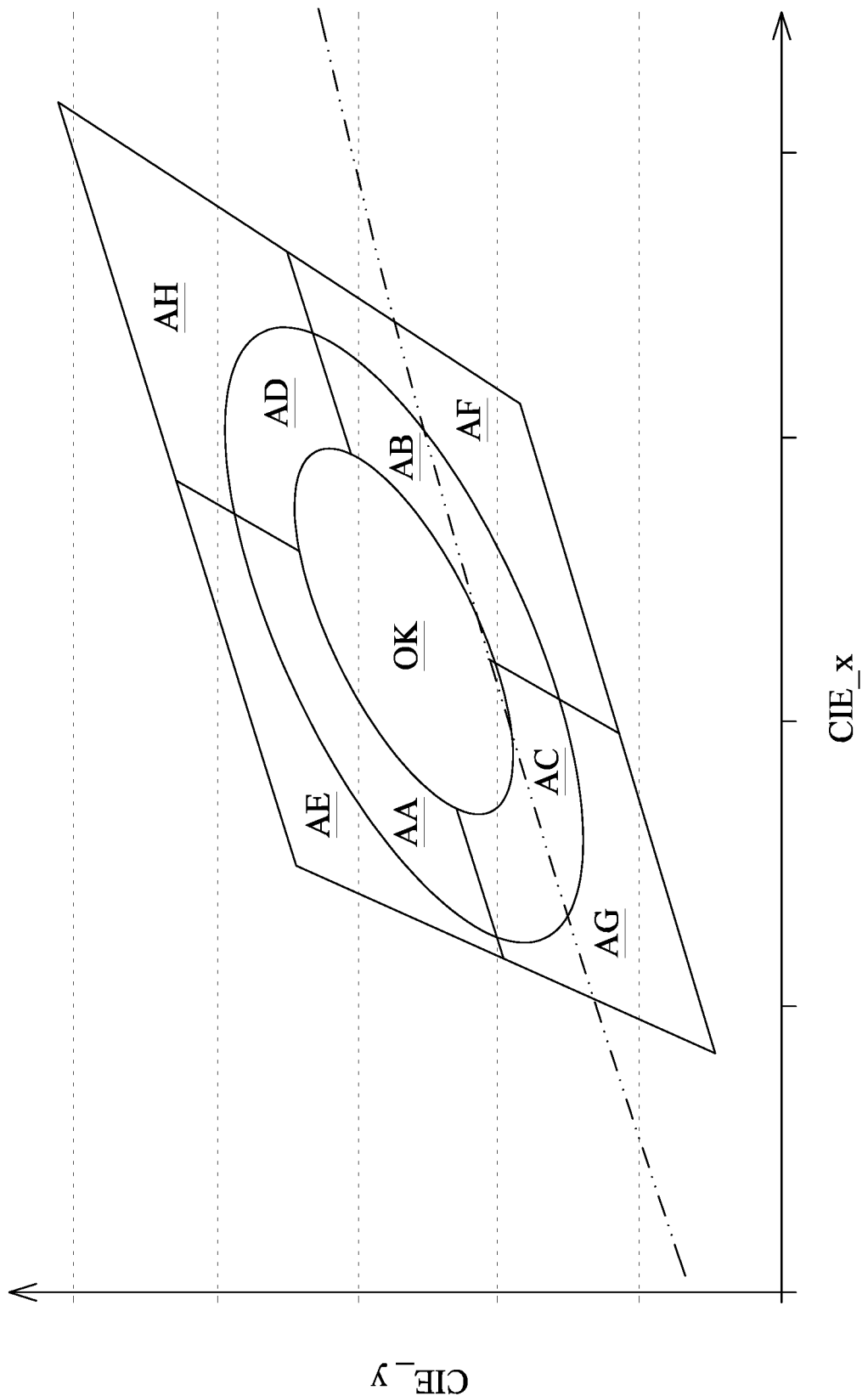
FIG. 14 is a color temperature graph of the first light source, the second light source, and the target light source according to the present disclosure.

Reference is now made to FIG. 14, which is a color temperature graph, and an area OK in the graph corresponds to a color temperature of the target light source K. The first light source and the second light source of the present disclosure respectively correspond to a light source in an area AC and a light source in an area AD, an area AA and a light source in an area AB, an area AE and a light source in an area AF, or an area AG and a light source in an area AH. In other words, the first light source and the second light source select light sources located on opposite sides of the target light source in the color temperature graph.

Based on the above-mentioned inventive concept, the first light source and the second light source can cooperate with the first condition to produce a plurality of embodiments. The following provides one embodiment for description.

Figure 15:
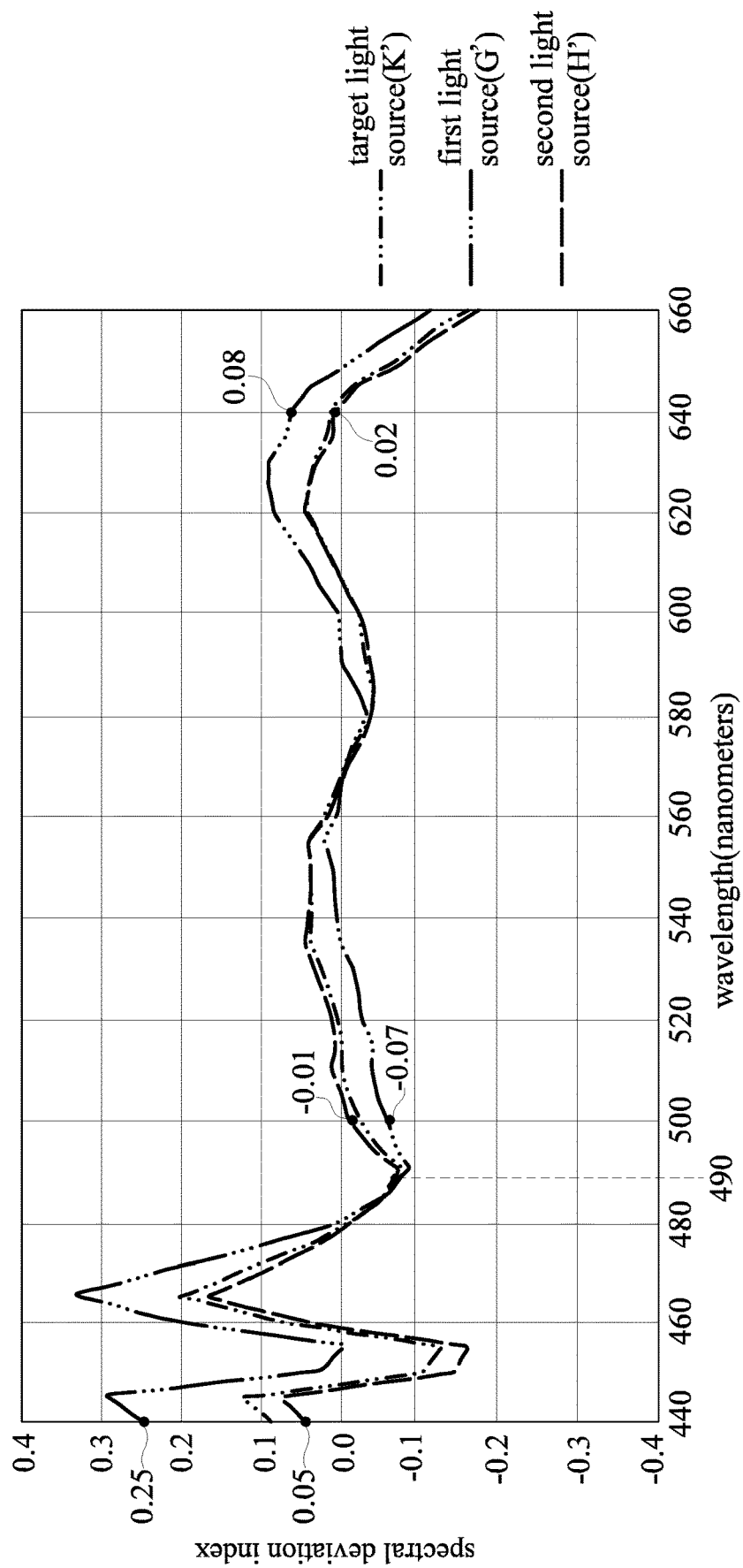
FIG. 15 is a diagram showing spectral deviation indexes of a first light source, a second light source, and a target light source according to a fourth embodiment of the present disclosure.
Figure 16:
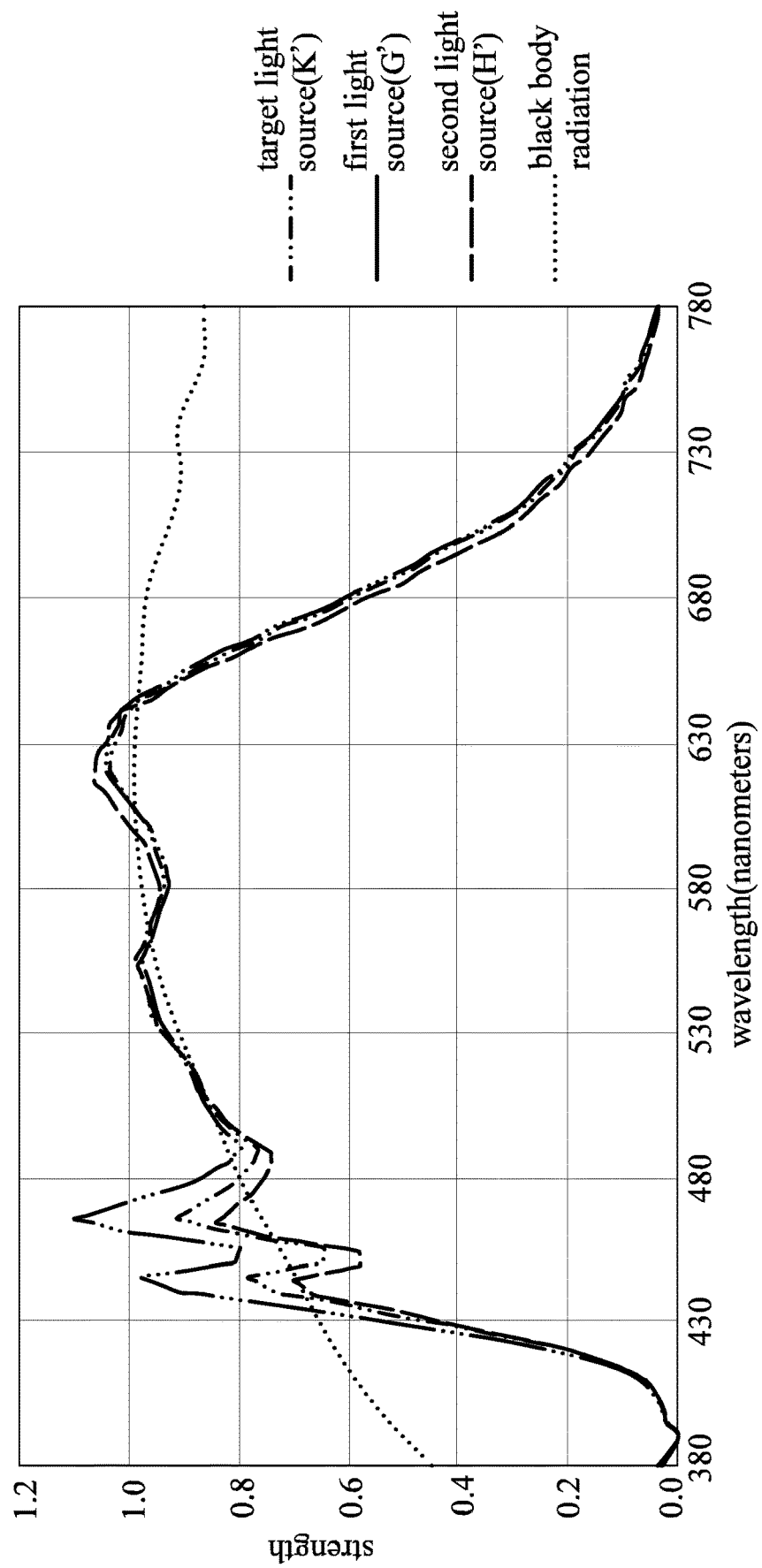
FIG. 16 is a white light spectrum diagram of the first light source, the second light source, the target light source, and a black body radiation according to the fourth embodiment of the present disclosure.

Referring to FIG. 14 to FIG. 16, the present embodiment provides the light emitting device 1000, and the light emitting device 1000 has a standard spectrum corresponding to a white light spectrum. The light emitting assembly 200 of the light emitting device 1000 includes a first light emitting diode package structure 210 and a second emitting diode package structure 220. The first light emitting diode package structure 210 can generate the first light source G', and the second light emitting diode package structure 220 can generate the second light source H'. In other words, the first light source G' and the second light source H' are light sources corresponding to the area AG and the area AH in FIG. 14. The first light source G' and the second light source H' can be mixed into a mixed light source.

It should be noted that in order to facilitate description of the technical features of the light emitting device 1000 of the present embodiment, the standard spectrum corresponding to the target light source K' is exemplified by black body radiation, but the present disclosure is not limited thereto.

For example, when a designer adjusts the target light source K' according to requirements, the standard spectrum can be adjusted according to the target light source K' to be another standard spectrum that corresponds to a specific light radiation.

The mixed light source is a final light source generated by the light emitting device 1000.

In order to ensure that the spectrum of the mixed light source and the spectrum of the target light source K' are consistent with each other, and to ensure that the spectrum of the mixed light source meet the qualified specification, each of the first light source G' and the second light source H' in the at least one spectral range a range between 440 and 660 nanometers is configured to satisfy a first condition.

It can be seen from FIG. 15 that when the at least one spectral range is within a range from 440 to 490 nanometers, 500 to 560 nanometers, or 600 to 660 nanometers, the difference between the first spectral deviation index and the second spectral deviation index is at least greater than 0.05.

For example, when the wavelength is at 440 nanometers, the first spectral deviation index is 0.25, and the second spectral deviation index is 0.05. That is, the difference between the first spectral deviation index and the second spectral deviation index is 0.20.

When the wavelength is at 500 nanometers, the first spectral deviation index is −0.01, and the second spectral deviation index is −0.07, i.e., the difference between the first spectral deviation index and the second spectral deviation index being 0.06. From this, the difference between the first spectral deviation index and the second spectral deviation index between 500 and 550 nanometers is obviously at least greater than 0.05.

In addition, when the wavelength is at 640 nanometers, the first spectral deviation index is 0.08, and the second spectral deviation index is 0.02, i.e., the difference between the first spectral deviation index and the second spectral deviation index being 0.06. From this, the difference between the first spectral deviation index and the second spectral deviation index between 620 and 660 nanometers is obviously at least greater than 0.05. In other words, each of the first light source G' and the second light source H' satisfies the first condition.

Reference is made to FIG. 16, which is a diagram showing a waveform of the first spectrum of the first light source G', a waveform of the second spectrum of the second light source H', a waveform of the target light source K' in the white light spectrum, and a waveform of the standard spectrum (i.e., the black body radiation). In other words, said diagram shows the white light spectrum of the first light source G' and the white light spectrum of the second light source H' that satisfy the first condition, the white light spectrum of the target light source K', as well as the standard spectrum. The horizontal axis of the diagram is wavelength (nm), and the vertical axis of the diagram is intensity.

It is obvious from FIG. 16 that, when each of the first light source G' and the second light source H' satisfies the first condition, the results are that the waveform of the target light source K' in the white light spectrum is located between the waveform of the first spectrum of the first light source G' and the second spectrum of the second chip H', and the target light source K', the first light source G', and the second light source H' are roughly the same. In other words, the spectrum of the mixed light source generated by mixing the first light source G' and the second light source H' are consistent with the spectrum of the target light source K'.

Beneficial Effects of the Embodiments

In conclusion, by virtue of "the mixed light source generated by the light emitting devices 1000 of the present disclosure being composed of the first light source and the second light source having different white light spectrums", the light emitting devices 1000 can use the light emitting diode package structures (i.e., the first light emitting diode package structure and the second light emitting diode package structure) having different white light spectrums, and the spectrum of each of the light emitting devices 1000 and the spectrum of the target light source are still consistent with each other, whilst meeting qualified specifications. Accordingly, a utilization rate of chips during manufacturing can be increased, and manufacturing costs can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting device having a standard spectrum that corresponds to a white light spectrum, the light emitting device comprising:
    a light emitting assembly, wherein the light emitting assembly is configured to generate a mixed light source that has a mixed light spectrum corresponding to the white light spectrum, wherein a value derived from an intensity of a wavelength of the mixed light spectrum minus an intensity of a wavelength of the standard spectrum corresponding to the wavelength of the mixed light spectrum and then divided by the intensity of the wavelength of the standard spectrum corresponding to the wavelength of the mixed light spectrum is defined as a spectral deviation index of the mixed light source, and wherein the light emitting assembly includes:
        a first light emitting diode package structure including a first chip and a first package body that covers the first chip, wherein the first chip cooperates with the first package body so as to generate a first light source that has a first spectrum corresponding to the white light spectrum, and wherein a value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index; and
        a second light emitting diode package structure including a second chip and a second package body that covers the second chip, wherein the second chip cooperates with the second package body so as to generate a second light source, wherein the white light spectrum of the second light source is different from the white light spectrum of the first light source, and the second light source has a second spectrum corresponding to the white light spectrum, and wherein a value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index;
    wherein the first light source and the second light source are mixed to form the mixed light source;
    wherein, when each of the wavelength of the first light source and the wavelength of the second light source is within a range from 460 to 500 nanometers, each of the first light source and the second light source is configured to satisfy a first condition and a second condition:
        the first condition is that a sum of the first spectral deviation index plus the second spectral deviation index is within a range from −0.3 to 0.3; and
        the second condition is that when the wavelength of the first light source and the wavelength of the second light source are the same, a difference between the first spectral deviation index and the second spectral deviation index is at least greater than 0.2;
    wherein, when each of the wavelength of the first light source and the wavelength of the second light source is within a range from 460 to 500 nanometers, an absolute value of the first spectral deviation index and an absolute value of the second spectral wave deviation index are each greater than or equal to 1.1 times of an absolute value of the spectral deviation index of the mixed light source.

2. The light emitting device according to claim 1, wherein the first spectral deviation index and the second spectral deviation index are opposite numbers to each other.

3. The light emitting device according to claim 1, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is greater than 2.5 nanometers, and a difference between the first intensity ratio and the second intensity ratio is greater than 0.2.

4. The light emitting device according to claim 1, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is less than or equal to 2.5 nanometers, and a difference between the first intensity ratio and the second intensity ratio is greater than 0.2.

5. The light emitting device according to claim 1, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is greater than or equal to 5 nanometers, and a difference between the first intensity ratio and the second intensity ratio is greater than 0.2.

6. The light emitting device according to claim 1, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a wavelength of the peak wavelength intensity of the first main wave and a wavelength of the peak wavelength intensity of the second main wave are within a range from 430 to 455 nanometers, and a wavelength of the peak wavelength intensity of the first shoulder wave and a wavelength of the peak wavelength intensity of the second shoulder wave are within a range from 445 to 475 nanometers.

7. The light emitting device according to claim 1, wherein the standard spectrum is of a specification corresponding to black body radiation.

8. The light emitting device according to claim 1, wherein, when each of the first light source and the second light source is within a range from 450 to 500 nanometers in the white light spectrum, the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

9. The light emitting device according to claim 1, wherein the spectral deviation index of the mixed light source is within a range from −0.3 to 0.4.

10. A light emitting device having a standard spectrum that corresponds to a white light spectrum, the light emitting device comprising:
a light emitting assembly, wherein the light emitting assembly is configured to generate a mixed light source that has a mixed light spectrum corresponding to the white light spectrum, and wherein the light emitting assembly includes:
a first light emitting diode package structure including a first chip and a first package body that covers the first chip, wherein the first chip cooperates with the first package body to generate a first light source that has a first spectrum corresponding to the white light spectrum, and wherein a value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index; and
a second light emitting diode package structure including a second chip and a second package body that covers the second chip, wherein the second chip cooperates with the second package body to generate a second light source, wherein the white light spectrum of the second light source is different from the white light spectrum of the first light source, and the second light source has a second spectrum corresponding to the white light spectrum, and wherein a value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index;
wherein each of the first light source and the second light source is configured to satisfy a first condition: the first condition is that when the first light source and the second light source in at least one spectral range a range between 440 and 660 nanometers have a same wavelength with each other, a difference between the first spectral deviation index and the second spectral deviation index is at least greater than 0.05.

11. The light emitting device according to claim 10, wherein the at least one spectral range is within a range from 440 to 490 nanometers, 500 to 560 nanometers, or 600 to 660 nanometers.

12. The light emitting device according to claim 10, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is less than or equal to 5 nanometers, and a difference between the first intensity ratio and the second intensity ratio is less than 0.4.

13. The light emitting device according to claim 10, wherein the standard spectrum is of a specification corresponding to black body radiation.

14. A light emitting device having a standard spectrum that corresponds to a white light spectrum, the light emitting device comprising:
a light emitting assembly, wherein the light emitting assembly is configured to generate a mixed light source that has a mixed light spectrum corresponding to the white light spectrum, wherein a value derived from an intensity of a wavelength of the mixed light spectrum minus an intensity of a wavelength of the standard spectrum corresponding to the wavelength of the mixed light spectrum and then divided by the intensity of the wavelength of the standard spectrum corresponding to the wavelength of the mixed light spectrum is defined as a spectral deviation index of the mixed light source, and wherein the light emitting assembly includes:
a first light emitting diode package structure including a first chip and a first package body that covers the first chip, wherein the first chip cooperates with the first package body so as to generate a first light source that has a first spectrum corresponding to the white light spectrum, and wherein a value derived from an intensity of a wavelength of the first spectrum minus an intensity of a wavelength of the standard spectrum corresponding to the wavelength of the first spectrum and then divided by the intensity of the wavelength of the standard spectrum corresponding to the wavelength of the first spectrum is defined as a first spectral deviation index; and
a second light emitting diode package structure including a second chip and a second package body that covers the second chip, wherein the second chip cooperates with the second package body so as to generate a second light source, wherein the white light spectrum of the second light source is different from the white light spectrum of the first light source, and the second light source has a second spectrum corresponding to the white light spectrum, and wherein a value derived from an intensity of a wavelength of the second spectrum minus an intensity of a wavelength of the standard spectrum corresponding to the wavelength of the second spectrum and then divided by the intensity of the wavelength of the standard spectrum corresponding to the wavelength of the second spectrum is defined as a second spectral deviation index;
wherein the first light source and the second light source are mixed to form the mixed light source;
wherein, when each of the wavelength of the first light source and the wavelength of the second light source is within a range from 460 to 500 nanometers, each of the first light source and the second light source is configured to satisfy a first condition and a second condition:
the first condition is that a sum of the first spectral deviation index plus the second spectral deviation index is within a range from −0.3 to 0.3; and
the second condition is that when the wavelength of the first light source and the wavelength of the second light source are the same, a difference between the first spectral deviation index and the second spectral deviation index is at least greater than 0.2;
wherein the intensity of the wavelength of the first spectrum is greater than the intensity of the wavelength of the standard spectrum corresponding to the wavelength of the first spectrum, and the intensity of the wavelength of the second spectrum is less than the intensity of the wavelength of the standard spectrum corresponding to the wavelength of the second spectrum.

15. The light emitting device according to claim 14, wherein the first spectral deviation index and the second spectral deviation index are opposite numbers to each other.

16. The light emitting device according to claim 14, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is greater than 2.5 nanometers, and a difference between the first intensity ratio and the second intensity ratio is greater than 0.2.

17. The light emitting device according to claim 14, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is less than or equal to 2.5 nanometers, and a difference between the first intensity ratio and the second intensity ratio is greater than 0.2.

18. The light emitting device according to claim 14, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a value derived from dividing the peak wavelength intensity of the first shoulder wave by the peak wavelength intensity of the first main wave is defined as a first intensity ratio; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a value derived from dividing the peak wavelength intensity of the second shoulder wave by the peak wavelength intensity of the second main wave is defined as a second intensity ratio; wherein a difference between the peak wavelength intensity of the first main wave and the peak wavelength intensity of the second main wave is greater than or equal to 5 nanometers, and a difference between the first intensity ratio and the second intensity ratio is greater than 0.2.

19. The light emitting device according to claim 14, wherein the standard spectrum is of a specification corresponding to black body radiation.

20. The light emitting device according to claim 14, wherein a light generated by the first chip has a first main wave and a first shoulder wave on a broad-band blue light spectrum; wherein the first main wave has a peak wavelength intensity, and the first shoulder wave has a peak wavelength intensity that is lower than the peak wavelength intensity of the first main wave; wherein a broad-band blue light spectrum of a light generated by the second chip is different from the broad-band blue light spectrum of the light generated by the first chip; wherein the light generated by the second chip has a second main wave and a second shoulder wave on the broad-band blue light spectrum; wherein the second main wave has a peak wavelength intensity, and the second shoulder wave has a peak wavelength intensity that is lower than the peak wavelength intensity of the second main wave; wherein a wavelength of the peak wavelength intensity of the first main wave and a wavelength of the peak wavelength intensity of the second main wave are within a range from 430 to 455 nanometers, and a wavelength of the peak wavelength intensity of the first shoulder wave and a wavelength of the peak wavelength intensity of the second shoulder wave are within a range from 445 to 475 nanometers.

* * * * *